（12）United States Patent
Ruberg et al.

(10) Patent No.: US 8,892,825 B2
(45) Date of Patent: *Nov. 18, 2014

(54) METHOD AND SYSTEM FOR IMPROVING SERIAL PORT MEMORY COMMUNICATION LATENCY AND RELIABILITY

(71) Applicant: Silicon Image, Inc., Sunnyvale, CA (US)

(72) Inventors: Alan Ruberg, Menlo Park, CA (US); Seung-jong Lee, Cupertino, CA (US); Hyung Rok Lee, Sunnyvale, CA (US); Daeyun Shim, Saratoga, CA (US); Dongyun Lee, Sunnyvale, CA (US); Sungjoon Kim, Cupertino, CA (US); Anu Murthy, Sunnyvale, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/850,147

(22) Filed: Mar. 25, 2013

(65) Prior Publication Data

US 2013/0282991 A1 Oct. 24, 2013

Related U.S. Application Data

(63) Continuation of application No. 12/605,134, filed on Oct. 23, 2009, now Pat. No. 8,407,427.

(60) Provisional application No. 61/109,480, filed on Oct. 29, 2008.

(51) Int. Cl.
*G06F 12/00* (2006.01)
*G06F 13/16* (2006.01)
*G11C 5/06* (2006.01)
*G06F 11/14* (2006.01)
*G11C 7/10* (2006.01)
*G06F 13/42* (2006.01)

(52) U.S. Cl.
CPC ............ *G06F 13/1663* (2013.01); *G11C 5/066*
(2013.01); *G06F 11/1443* (2013.01); *G11C 7/1075* (2013.01); *G06F 11/141* (2013.01); *G06F 13/4234* (2013.01)
USPC ............................ 711/149; 711/154; 711/168

(58) Field of Classification Search
USPC ......................................................... 711/149
See application file for complete search history.

(56) References Cited

U.S. PATENT DOCUMENTS 4,807,189 A * 2/1989 Pinkham et al. ......... 365/189.05
5,337,414 A 8/1994 Hashemi et al.
(Continued)

FOREIGN PATENT DOCUMENTS

CN 1570899 A 1/2005
CN 1573723 A 2/2005
(Continued)

OTHER PUBLICATIONS

Chinese First Office Action, Chinese Application No. 200980143643.9, May 31, 2013, 15 pages.
(Continued)

*Primary Examiner* — April Y Blair
*Assistant Examiner* — Prasith Thammavong
(74) *Attorney, Agent, or Firm* — Fenwick & West LLP

(57) ABSTRACT

A method, apparatus and system for reducing memory latency is disclosed. In one embodiment, data between a host computer system and a memory is communicated via a port or a group of ports at the memory over multiple time intervals, wherein the host computer is coupled to the memory. Further, a command associated with the data is communicated between the host computer system and the memory via the port or the group of ports over a single time interval.

20 Claims, 23 Drawing Sheets

(56) References Cited

U.S. PATENT DOCUMENTS

| | | |
|---|---|---|
| 5,502,728 A | 3/1996 | Smith, III |
| 2004/0064663 A1 | 4/2004 | Grisenthwaite |
| 2004/0240461 A1* | 12/2004 | Hook .......................... 370/431 |
| 2006/0101956 A1 | 5/2006 | Hermansen et al. |
| 2006/0106956 A1* | 5/2006 | Hillier et al. .................... 710/40 |
| 2006/0187739 A1 | 8/2006 | Borkenhagen et al. |
| 2007/0226590 A1 | 9/2007 | Nagai |

FOREIGN PATENT DOCUMENTS

| | | |
|---|---|---|
| CN | 101055553 A | 10/2007 |
| EP | 1482690 | 12/2004 |
| JP | H01-111279 A | 4/1989 |
| JP | 01-144119 A | 6/1989 |
| JP | 06-083717 A | 3/1994 |
| JP | 09-282868 A | 10/1997 |
| JP | 10-340224 A | 12/1998 |
| JP | 2001-166986 A | 6/2001 |
| JP | 2002-063791 A | 2/2002 |
| JP | 2004-355621 A | 12/2004 |
| JP | 2006-127653 A | 5/2006 |
| TW | 200613979 | 5/2006 |
| TW | 200613993 | 5/2006 |

OTHER PUBLICATIONS

Chinese Second Office Action, Chinese Application No. 200980143643.9, Feb. 18, 2014, 7 pages.
"PCT/US2009/062231, PCT International Search Report and Written Opinion, mailed Jun. 21, 2010 24 pages".
European Extended Search Report, European Application No. 14168733.5, Jul. 21, 2014, 7 pages.
Taiwan Office Action, Taiwan Application No. 098136752, Jun. 17, 2014, 7 pages. (with concise explanation of relevance).

* cited by examiner

276
1 Port:
- 16-bit data access
- Single Command

277
2 Port:
- 32-bit data access
- 32-bit Commands or Command Duplication

278
4 or more Ports:
- 64-bit data access
- Simultaneous 32-bit Commands and Duplication

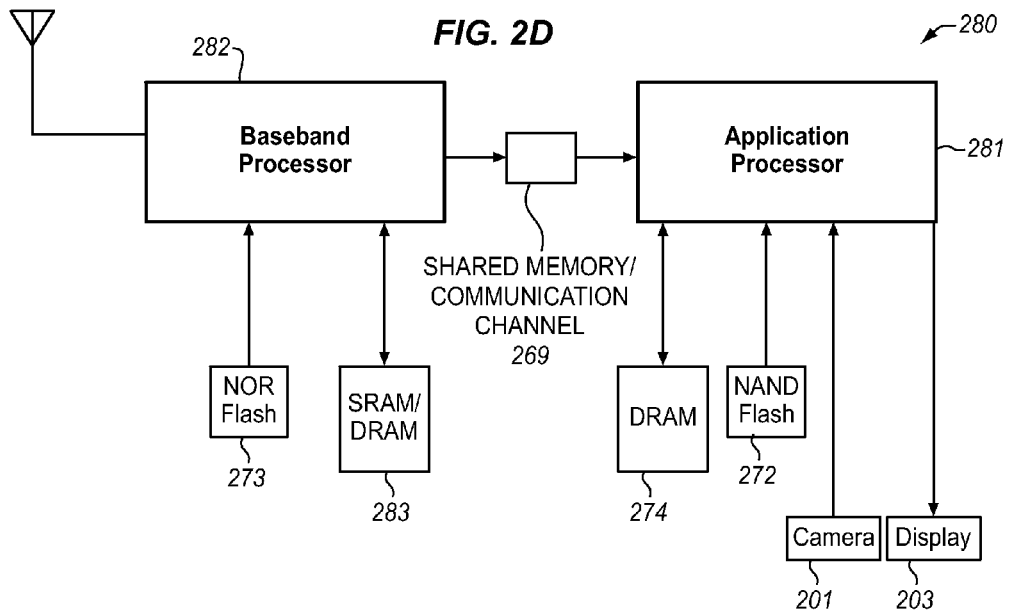
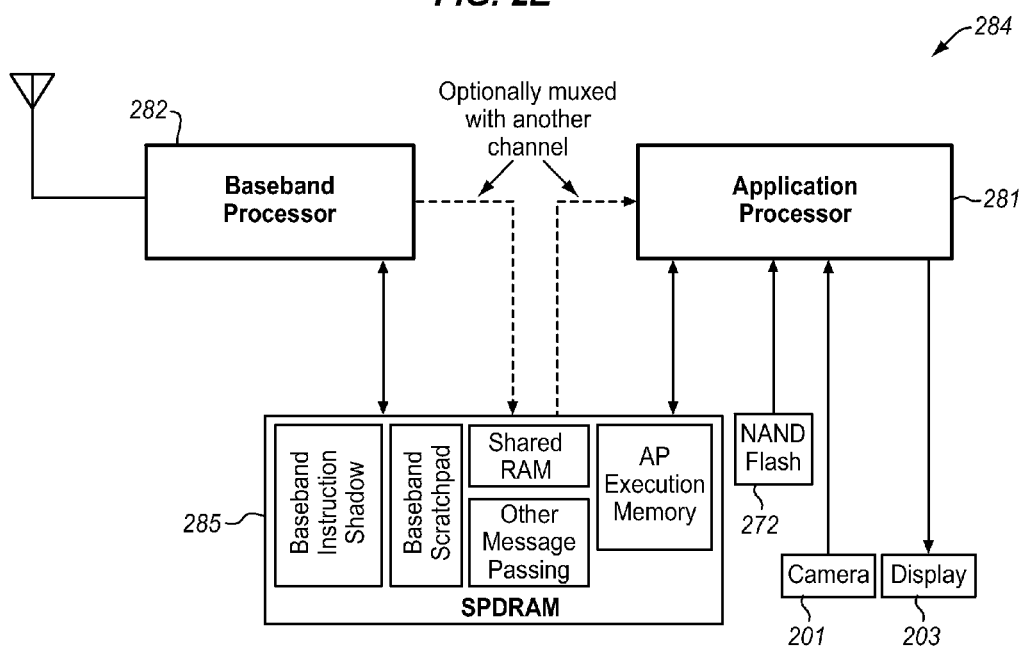

2 Independent Hosts
- dual port/host

↰
286

2 Independent Hosts
- Host 1: single port
- Host 2: dual port

↰
287

4 Independent Hosts
- One host per port

↰
288

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| Ports 15-0 | Ports 15-8 | Ports 15-12 | Ports 11-8 | Ports 15-14 | Ports 13-12 | Ports 11-10 | Ports 9-8 | X | Ports 7-0 | Ports 7-4 | Ports 3-0 | Ports 7-6 | Ports 5-4 | Ports 3-2 | Ports 1-0 |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| Port 15 | Port 14 | Port 13 | Port 12 | Port 11 | Port 10 | Port 9 | Port 8 | Port 7 | Port 6 | Port 5 | Port 4 | Port 3 | Port 2 | Port 1 | Port 0 |

| port_rdy[3:0] | lane0 | lane1 | lane2 | lane3 |
|---|---|---|---|---|
| 0000 | Don't Care | Don't Care | Don't Care | Don't Care |
| 0001 | port0 | port0 | port0 | port0 |
| 0010 | port1 | port1 | port1 | port1 |
| 0011 | port0 | port1 | port0 | port1 |
| 0100 | port2 | port2 | port2 | port2 |
| 0101 | Invalid | Invalid | Invalid | Invalid |
| 0110 | Invalid | Invalid | Invalid | Invalid |
| 0111 | Invalid | Invalid | Invalid | Invalid |
| 1000 | port3 | port3 | port3 | port3 |
| 1001 | Invalid | Invalid | Invalid | Invalid |
| 1010 | Invalid | Invalid | Invalid | Invalid |
| 1011 | Invalid | Invalid | Invalid | Invalid |
| 1100 | port2 | port3 | port2 | port3 |
| 1101 | Invalid | Invalid | Invalid | Invalid |
| 1110 | Invalid | Invalid | Invalid | Invalid |
| 1111 | port0 | port1 | port2 | port3 |

297

| port_rdy[3:0] | Cycle 0 | Cycle 1 | Cycle 2 | Cycle 3 |
|---|---|---|---|---|
| 0000 | Reset Cycle | Reset Cycle | Reset Cycle | Reset Cycle |
| 0001 | 0001 | 0010 | 0100 | 1000 |
| 0010 | 0001 | 0010 | 0100 | 1000 |
| 0011 | 0011 | 1100 | 0011 | 1100 |
| 0100 | 0001 | 0010 | 0100 | 1000 |
| 0101 | Invalid | Invalid | Invalid | Invalid |
| 0110 | Invalid | Invalid | Invalid | Invalid |
| 0111 | Invalid | Invalid | Invalid | Invalid |
| 1000 | 0001 | 0010 | 0100 | 1000 |
| 1001 | Invalid | Invalid | Invalid | Invalid |
| 1010 | Invalid | Invalid | Invalid | Invalid |
| 1011 | Invalid | Invalid | Invalid | Invalid |
| 1100 | 0011 | 1100 | 0011 | 1100 |
| 1101 | Invalid | Invalid | Invalid | Invalid |
| 1110 | Invalid | Invalid | Invalid | Invalid |
| 1111 | 1111 | 1111 | 1111 | 1111 |

| Port 0 | Cycle | | | |
|---|---|---|---|---|
| port_snd[3:0] | 0 | 1 | 2 | 3 |
| XXX0 | None | None | None | None |
| 0001 | lane0 | lane1 | lane2 | lane3 |
| 0011 | lane0 | lane2 | lane0 | lane2 |
| 0101 | Invalid | Invalid | Invalid | Invalid |
| 0111 | Invalid | Invalid | Invalid | Invalid |
| 1001 | Invalid | Invalid | Invalid | Invalid |
| 1011 | Invalid | Invalid | Invalid | Invalid |
| 1101 | Invalid | Invalid | Invalid | Invalid |
| 1111 | lane0 | lane0 | lane0 | lane0 |

| Port 1 | Cycle | | | |
|---|---|---|---|---|
| port_snd[3:0] | 0 | 1 | 2 | 3 |
| XX0X | None | None | None | None |
| 0010 | lane0 | lane1 | lane2 | lane3 |
| 0011 | lane1 | lane3 | lane1 | lane3 |
| 0110 | Invalid | Invalid | Invalid | Invalid |
| 0111 | Invalid | Invalid | Invalid | Invalid |
| 1010 | Invalid | Invalid | Invalid | Invalid |
| 1011 | Invalid | Invalid | Invalid | Invalid |
| 1110 | Invalid | Invalid | Invalid | Invalid |
| 1111 | lane1 | lane1 | lane1 | lane1 |

| Port 2 | Cycle | | | |
|---|---|---|---|---|
| port_snd[3:0] | 0 | 1 | 2 | 3 |
| X0XX | None | None | None | None |
| 0100 | lane0 | lane1 | lane2 | lane3 |
| 0101 | Invalid | Invalid | Invalid | Invalid |
| 0110 | Invalid | Invalid | Invalid | Invalid |
| 0111 | Invalid | Invalid | Invalid | Invalid |
| 1100 | lane0 | lane2 | lane0 | lane2 |
| 1101 | Invalid | Invalid | Invalid | Invalid |
| 1110 | Invalid | Invalid | Invalid | Invalid |
| 1111 | lane2 | lane2 | lane2 | lane2 |

| Port 3 | Cycle | | | |
|---|---|---|---|---|
| port_snd[3:0] | 0 | 1 | 2 | 3 |
| 0XXX | None | None | None | None |
| 1000 | lane0 | lane1 | lane2 | lane3 |
| 1001 | Invalid | Invalid | Invalid | Invalid |
| 1010 | Invalid | Invalid | Invalid | Invalid |
| 1011 | Invalid | Invalid | Invalid | Invalid |
| 1100 | lane1 | lane3 | lane1 | lane3 |
| 1101 | Invalid | Invalid | Invalid | Invalid |
| 1110 | Invalid | Invalid | Invalid | Invalid |
| 1111 | lane3 | lane3 | lane3 | lane3 |

| | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|
| | DATA | ACT | CMD | | | Bank | | | | SubCmd | | | | FLAGS | | | |
| LINK SYNCHRONIZATION GROUP ⌐724  ⌐722 ||||||||||||||||||
| 730→ SYNC | 0 | 0 | 0 | 0 | 0 | 1 | 1 | 1 | 1 | 0 | 1 | 0 | 1 | 1 | 0 | 0 | 0 |
| 732→ SYNC2 | 0 | 0 | 0 | 0 | 0 | 1 | 1 | 1 | 1 | 0 | 1 | 0 | 1 | 1 | 1 | 0 | 1 |
| DRAM DATA ||||||||||||||||||
| 734→ DATA | 1 | Upper Byte |||||||| Lower Byte ||||||||
| DRAM COMMAND GROUP ←728 ||||||||||||||||||
| 736→ ABNK | 0 | 0 | 1 | 1 | 1 | Bank ||| RFU | BL || Row Upper ||||
| 738→ ACT | 0 | 1 | Row Lower |||||||||||||||
| 740→ WR | 0 | 0 | 1 | 0 | AP | Bank ||| Col |||||||||
| 742→ WMSK | 0 | 0 | 1 | 1 | 0 | Bank ||| Mask |||||||||
| 744→ RD | 0 | 0 | 0 | 1 | AP | Bank ||| Col |||||||||
| 746→ BSTP | 0 | 0 | 1 | 1 | 1 | Bank ||| 1 | 1 | 1 | 1 | 0 | 1 | 0 | 0 |
| 748→ PCG | 0 | 0 | 1 | 1 | 1 | Bank ||| 1 | 1 | 1 | 1 | 0 | 0 | 0 | 0 |
| 750→ PCA | 0 | 0 | 1 | 1 | 1 | RFU ||| 1 | 1 | 1 | 1 | 0 | 0 | 0 | 1 |
| 752→ REFB | 0 | 0 | 1 | 1 | 1 | Bank ||| 1 | 1 | 1 | 1 | 0 | 0 | 1 | 0 |
| 754→ REFA | 0 | 0 | 1 | 1 | 1 | RFU ||| 1 | 1 | 1 | 1 | 0 | 0 | 1 | 1 |
| MODE REGISTER GROUP ←726 ||||||||||||||||||
| 756→ MRR | 0 | 0 | 1 | 1 | 1 | Upper Addr ||| 1 | 0 | 0 | 1 | Lower Addr ||||
| 758→ MRW | 0 | 0 | 1 | 1 | 1 | Upper Addr ||| 1 | 0 | 1 | 0 | Lower Addr ||||
| 760→ MRD | 0 | 0 | 1 | 1 | 1 | Upper Data ||| 1 | 0 | 0 | 0 | Lower Data ||||
| POWER MANAGEMENT GROUP ||||||||||||||||||
| 762→ SRPD | 0 | 0 | 1 | 1 | 1 | RFU ||| 1 | 1 | 1 | 1 | 0 | 1 | 0 | 1 |
| 764→ PDX | 0 | 0 | 1 | 1 | 1 | RFU ||| 1 | 1 | 1 | 1 | 0 | 1 | 1 | 0 |

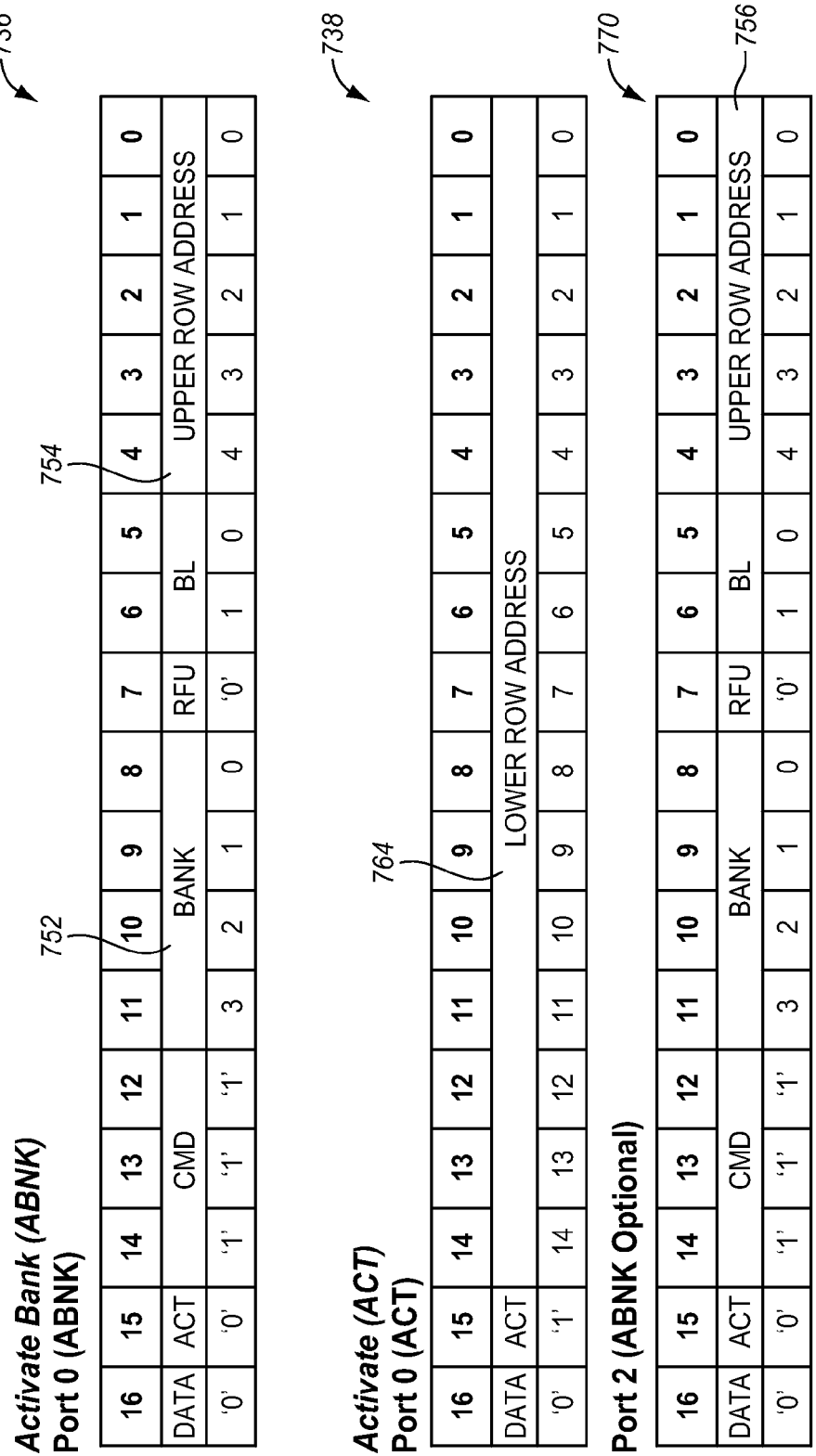

FIG. 7D

Write Mask (WMSK)
Port 0 (WMSK) → 742

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| DATA | ACT | CMD | | | BANK | | | | MASK BITS | | | | | | | ← 772 |
| '0' | '0' | '1' | '1' | '0' | 3 | 2 | 1 | 0 | 3H | 3L | 2H | 2L | 1H | 1L | 0H | 0L |

WRITE (WR)
Port 0 (WR) → 740

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| DATA | ACT | CMD | | | BANK | | | | COLUMN ADDRESS | | | | | | | ← 776 |
| '0' | '0' | '1' | '0' | PCG ←774 | 3 | 2 | 1 | 0 | 7 | 6 | 5 | 4 | 3 | 2 | 1 | 0 |

Port 2 (WMSK Optional) → 780

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| DATA | ACT | CMD | | | BANK | | | | MASK BITS | | | | | | | ← 778 |
| '0' | '0' | '1' | '1' | '0' | 3 | 2 | 1 | 0 | 3H | 3L | 2H | 2L | 1H | 1L | 0H | 0L |

METHOD AND SYSTEM FOR IMPROVING SERIAL PORT MEMORY COMMUNICATION LATENCY AND RELIABILITY

RELATED APPLICATION

This application is a continuation of U.S. patent application Ser. No. 12/605,134, entitled "METHOD AND SYSTEM FOR IMPROVING SERIAL PORT MEMORY COMMUNICATION LATENCY AND RELIABILITY" by Alan Ruberg, et al., filed Oct. 23, 2009, and claims the benefit of U.S. Provisional Patent Application No. 61/109,480, entitled "METHOD AND SYSTEM FOR IMPROVING SERIAL PORT MEMORY COMMUNICATION LATENCY AND RELIABILITY" by Hyung Rok Lee, et al., filed Oct. 29, 2008, the entire contents of which are incorporated herein by reference and priority is claimed thereof.

FIELD

Embodiments of the invention generally relate to the field of computer memory and, more particularly, to improve serial port memory communication latency and reliability.

BACKGROUND

In memory systems that use high-speed serial interfaces, where commands and data are transferred between a host (e.g., system-on-a-chip, computer, graphics controller, etc.) or a plurality of hosts and memory through individual ports, it is desirable to provide maximum bandwidth combined with some error detection to ensure proper system operation.

Serial links have inherent latency because only one bit is sent at a time. Furthermore, the serialization and de-serialization process incurs additional latency. Using the ports individually does not significantly improve latency, and a stylized access method is to be used (e.g., accessing different, dedicated, memory regions from each port, such as in striped accesses) to improve the bandwidth. By enabling port binding (using multiple ports in concert), memory latency can be reduced by having several bits of data transferred at once, while increasing the bandwidth without needing a stylized access method.

Memory also requires a certain amount of data security. For example, in a serial channel, it is possible to have errors occur that cannot be detected except using methods that introduce unacceptable latency. In a bound port situation, some ports remain idle during command periods. This unused bandwidth is filled with duplicates of commands in those same periods. This method extends to single ports using temporal duplication, providing the feature to port configurations.

FIG. 1 illustrates a conventional serial bit assignment 100 in the EIA standard RS-232-C. In the illustration, the serial transfer of data is similar to an RS-232 link where individual binary values (bits) 102-118 are assembled into a whole value 124 by observing them one at a time in turn and assigning them to different significance within the value 124. For example, if the first bit is 104 assigned to the most significant bit in the value 124, the second bit 106 following, and so on until the least significant bit is filled by the last bit 118 communicated. This assembled value in this case is called a frame 128 that includes the value 124 as well as stop and start bits 102, 120. Further, the frame 128 is delineated using extra bits, called framing bits 126 including start bit 120 and stop bit 122, that the receiver can use to find the beginning of a frame 128 and to check whether the frames are arriving when expected. In other schemes, framing bits 126 are used to help the receiver reliably find individual bits even when the data rate between the transmitter and receiver is slightly different or changing.

Communication to memory over individual serial links introduces a great deal of latency, and providing access to a single memory by more than one host introduces memory resource complications. Further, a memory can have one or more ports, each including a serial transmitter and a serial receiver and associated circuitry to improve latency and bandwidth. In a bound port situation, some ports remain idle during command periods. This unused bandwidth is filled with spatial duplicates of commands in the same time periods, and the method extends to single ports using temporal duplication in different time periods, providing the feature to all port configurations. In a bound port situation, data is sent on multiple ports, but commands must stand alone. First, unused ports may include command duplicates. Second, certain commands can be issued at the same time. Furthermore, serial communication increases latency over parallel communication because of serialization, de-serialization, framing the data for error management, and additional processes, such as synchronization.

It is, therefore, desirable to introduce and employ techniques to decrease memory latency.

SUMMARY

A method, apparatus and system for improving port memory communication latency and reliability is disclosed.

In one embodiment, a method includes communicating data between a host computer system and a memory via a group of ports at the memory over multiple time intervals, wherein the host computer is coupled to the memory, and communicating a command associated with the data between the host computer system and the memory via a port of the group of ports over a single time interval.

In one embodiment, an apparatus includes a host computer system coupled to a memory, the memory to receive data from the host computer system via a group of ports at the memory over multiple time intervals. The memory is further modified to receive a command associated with the data from the host computer system via a port of the group of ports over a single time interval.

In one embodiment, a method includes communicating data between a host computer system and a memory where the number of ports in a group can be selected ad hoc for the purpose of varying the bandwidth and latency and/or saving power.

In one embodiment, an apparatus includes communicating data between a host computer system and a memory to select the number of ports in a group ad hoc for the purpose of varying the bandwidth and latency and/or saving power.

In one embodiment, a system to connect a plurality of hosts to a memory is disclosed. The system includes a host computer systems or functions within a computer system coupled with a memory, the memory employing a port binding system to reduce the memory latency, the port binding system having a plurality of ports for communication of data and commands, wherein two or more ports of the plurality of ports are capable being combined ad hoc into one or more groups of ports, the port binding system to communicate data between the hosts and the memory via a group of ports at the memory over multiple time intervals, and communicate a command associated with the data between the hosts and the memory via a port of the group of ports over a single time interval.

BRIEF DESCRIPTION OF THE DRAWINGS

Embodiments of the invention are illustrated by way of example, and not by way of limitation, in the figures of the accompanying drawings in which like reference numerals refer to similar elements:

FIG. 2D illustrates an embodiment of a smart mobile phone architecture;

FIG. 2E illustrates an alternate embodiment from FIG. 2D of a smart phone architecture that utilizes a Serial Port DRAM (SPDRAM);

FIG. 2H illustrates embodiments of a port binding control register for up to 16 ports and a duplicate command check register for up to 16 ports;

FIG. 2J illustrates embodiments of tables illustrating binding demultiplexer routing;

FIG. 2L illustrates an embodiment of tables illustrating binding multiplexer routing;

FIG. 7B illustrates an embodiment of a command, status, and data encoding frame;

FIG. 7C illustrates an embodiment of active bank and active commands;

FIG. 7D illustrates an embodiment of a write mask and write command;

DETAILED DESCRIPTION

Embodiments of the invention are generally directed to improving serial port memory communication latency and reliability; however, they may be equally applicable to other styles of interface, such as high-speed parallel.

Figure 1:
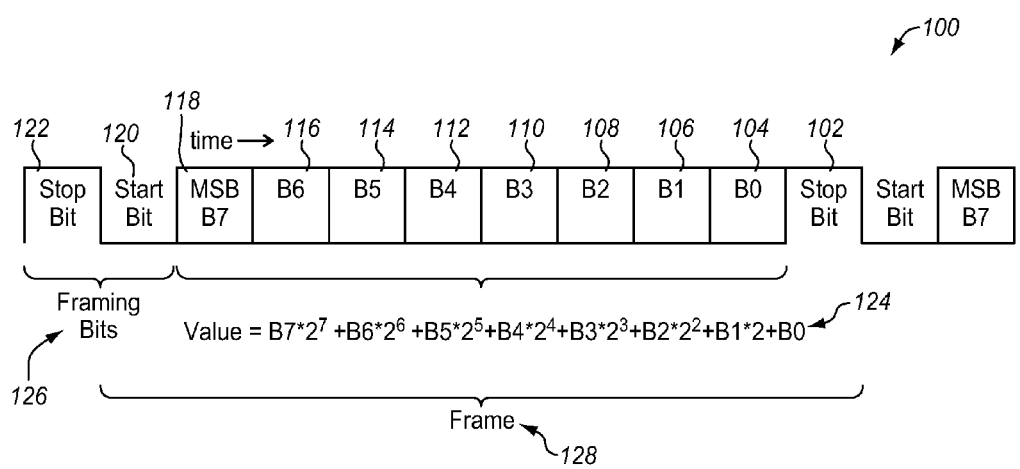
FIG. 1 illustrates a conventional serial bit assignment in RS-232.

As used herein, "memory" refers to a component in a computer system (e.g. FIGS. 2D, 2E) that is responsible for retrieving previously stored data for use by any "host,' such as a computing processor or peripheral such as a keyboard, display, camera, mass storage (magnetic disk, optical disk, magnetic tape, etc.), network controller, or wireless network. Typically, memory is coupled to one or more micro-processors for processing data in a computer system. Data can be stored in memory by a host, such as for random access memory (RAM), static RAM (SRAM), dynamic RAM (DRAM), FLASH, PROM (programmable read-only memory), erasable PROM (EPROM), electrically erasable PROM (EEPROM), or pre-determined such as the case for read-only memory (ROM). The memory can be accessed directly by the host, through a bus, such as PCI, or through intermediate memory controllers. Serial access to memory involves converting between a single sequence of electrical signals propagating through a single circuit and meaningful commands and data to and from a memory (similarly to RS-232 as presented in FIG. 1). The circuit that performs this conversion is referred to as a "port."

In one embodiment, to decrease memory latency a masking scheme is employed such that write commands and data can be described without including the mask information within the same communication frame, reducing the number of bits in a frame and reducing latency. Further, to decrease latency, a memory-based protocol is provided to reduce latency with shorter frame sizes, provide greater extensibility versus legacy Dynamic Random Access Memory (DRAM) protocols, and reduce command set changes as bandwidths increase.

Figure 2A:
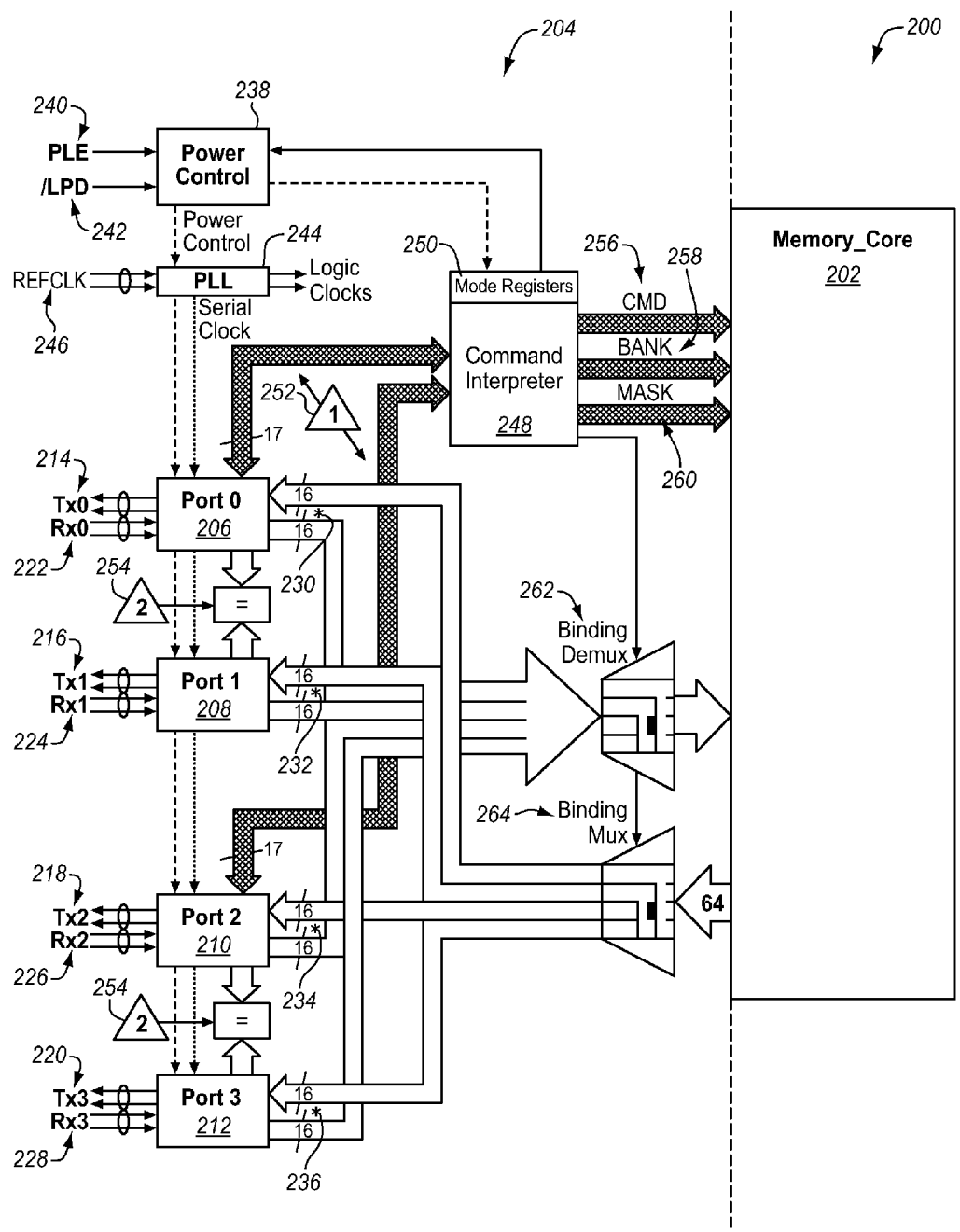
FIG. 2A illustrates an embodiment of a single host bound port memory.

FIG. 2A illustrates an embodiment of a single host bound port memory 200. The illustrated embodiment of the bound port memory 200 includes a core memory 202 (e.g., DRAM, FLASH) having a number of banks (e.g., 8 banks) is associated with the bound port memory system 204 of the bound port memory 200. The banks of the memory core 202 are in communication with a number of ports, such as 4 ports 206-212. All 4 ports 206-212 work together, providing an interface to a single host with variable bandwidth. The banks are used independently, such as when the simultaneous reading is from one bank and writing is from another bank. Memory core 202 may also include a memory read bus for reading data and a memory write bus for writing data; however, there may be a single connection within the memory core 202 to both read and write data. Further, the bound port memory system 204 includes a binding multiplexer 264 and a binding de-multiplexer 262 that are described in FIGS. 2K and 2I, respectively.

In conventional techniques, all command and data bits sent are at once over individual parallel wires that are to arrive at the same time for the code to be formed; however, as the speed gets faster, the data through these individual wires could get sampled (e.g. using an associated clock signal) incorrectly or at the wrong time. To solve the high-speed sampling problem, a self-sampled serial signal (such as RS-232 in FIG. 1) is utilized; however, the latency increased over the parallel method because data is to be processed temporally. In one embodiment, communications latency and reliability for serial port communication with memory employs the grouping of multiple serial interfaces, or ports, and duplicating commands, either one after another, or temporally, or at the same time between ports, or spatially. One embodiment of this technique is illustrated here and employed by the single host port bound port memory 200.

In one embodiment, a transmitter (Tx) may turn parallel data of 16 bits into a serial bit stream and transmits the single bit stream, while a receiver (Rx) receives the 16-bit single stream and then it may turn it into a parallel stream. A local memory, in this case, may be 32-bit wide at roughly the same rate. In the illustrated port memory 200, four ports 206-212 are employed and thus, there is a 128-bit movement of data with a 64-bit data streaming each way through the 4 ports 206-212 (e.g., 16 bits multiplied by 4 ports equaling 64 bits each way). This 128-bit movement is supported by the necessary circuitry inside the chip.

Unlike conventional techniques, each port 206-212 uses a serializer/de-serializer to serialize and de-serialize data streams at a faster rate. For example, a PLL may be used to multiply an input clock to a higher speed to match the incoming data rate that is used to sample individual bits. Although the arrival time of data streams at ports 206-212 may be slightly different, the flow of such data streams is made faster. In other words each steam is flowing at the same speed, but at a much higher speed. Further, the timing of individual bits may not be entirely perfect, but there is no need to align the bits as the actual arrival time of such bits does not matter and thus, instead of synchronizing each bit at the pin, the bits are synchronized after de-serialization within each port 206-212, for example, as indicated by asterisks 232-238. Also, the speed at which the data bits flow after de-serialization the ports 206-212 at or near these asterisks 232-238 may be 20 times slower (e.g., 5 nanoseconds) than the high-speed external memory interface 214-228 (e.g., 250 picoseconds). In one embodiment, the ports 206-212 are capable of phase detection, management of data bits, the sampling of such data bits, and lane alignment.

Figure 2B:
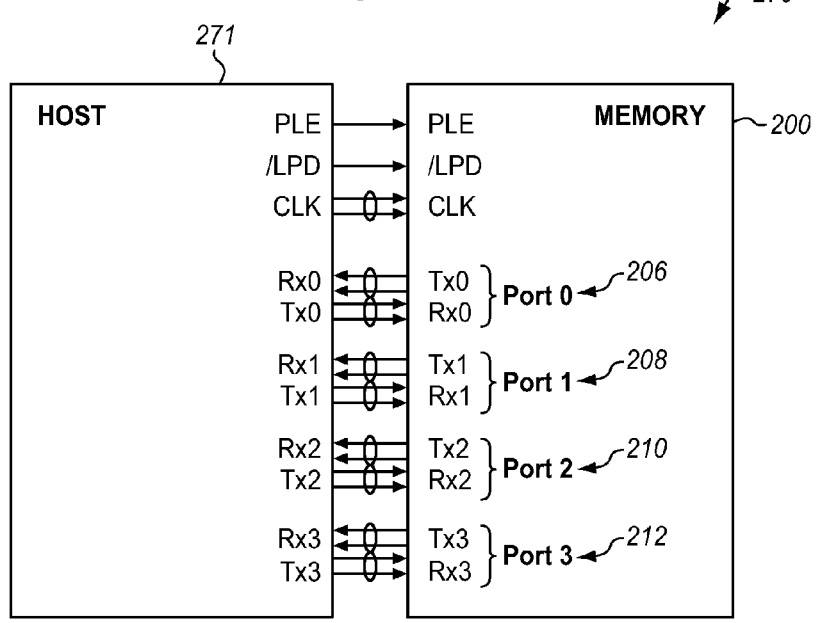
FIG. 2B illustrates an embodiment of a single host connection of a four-port memory.
Figure 2C:
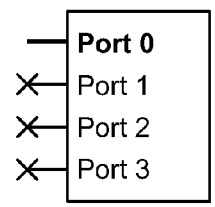
FIG. 2C illustrates an embodiment of a port binding selection for a single host interface.
Figure 2C:
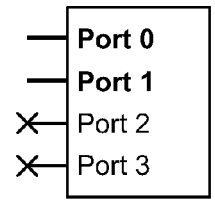
Figure 2C:
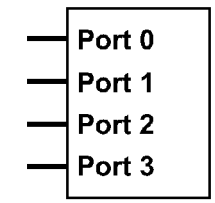

Command interpreter 248 continues to process commands, adjunct/closely-related commands based on lane configuration (further described in FIGS. 2C, 7C, and 7D).

FIG. 2B illustrates an embodiment of a single host connection 270 of a four-port memory 200. The illustrated embodiment of the connection 270 of the memory 200 to a host 271. Host 271 makes a one read and one write operation at a time. SPMT defines grouping ports together to form a wide data communication, while the number of number of ports 206-212 in a binding group is dynamically selectable. For example, a single port can be used, or any number of ports can be bound up to the number of ports 206-212 provided (e.g., power of 2). When fewer ports are used, fewer pins are used and less power is used. When more ports are used, the bandwidth is increased and the resulting latency to retrieve the same amount of data is decreased. It is contemplated that the number of bound ports may be changed at any time.

FIG. 2C illustrates an embodiment of a port binding selection 275 for a single host interface. When two or more ports are bound 277, 278, the data is transferred on all ports in the group, effectively multiplying data bandwidth. However, an individual command may need merely one port, leaving the remainder of the ports unused and therefore, to avoid wasting the bandwidth, enhance memory operation, and save command bandwidth, a set of closely related commands or adjunct commands are provided. These commands make proper use of the extra bandwidth that otherwise would have been wasted and such closely related/adjunct commands may be issued before or after a command can be issued at the same time on other ports. For example, when an active command (ACT) is issued, the active bank command (ABNK) can be issued at the same time as an adjunct to complete the command. Likewise, adjunct write mask command (WMSK) can accompany a write command (WR) at the same time. All commands can be accepted at port 0, but related adjunct commands can be accepted at other ports to save command bandwidth. Commands ACT, ABNK, WR, and WMSK are further described with reference to FIGS. 7B-7D.

Further, a single option enables command duplication for enhanced error detection to prevent an errant command from corrupting memory operational state. With this option enabled, a single port compares a command in the first frame to a duplicate in the following frame. No additional bandwidth is used for duplicates when two or more ports are bound 277, 278 and used because the duplicate appears on another port at the same time. Although commands are duplicated, the data in this embodiment is not duplicated. When there are at least four bound ports 278, both duplication and adjunct commands may be used at the same time.

FIG. 2D illustrates an embodiment of a smart mobile phone architecture 280 comprised of a baseband processor 282 and an application processor 281, and individual volatile memory (e.g., DRAM 274, SRAM/DRAM 283), and non-volatile memory (e.g., NAND 272 and NOR flash 273), and a communication channel 269 between the two processors 281, 282. The memories 272-274, 283 are used to store and retrieve executable program codes as well as data that remains private to respective connected processors with no sharing. Any sharing or communication is performed through the communication channel 269. Application processor 281 may be coupled to other peripheral devices, such as a camera 201 and a display device 203.

FIG. 2E illustrates an alternate embodiment from FIG. 2D of a smart phone architecture 284 having an SPDRAM 285. In one embodiment, the memory is being shared between the baseband processor 282 and the application processor 281. In this embodiment, SPDRAM 285 may be used to communicate between the baseband processor and the application processor, store program codes and data for both processors, and reduce the number of memory components or technologies required to implement the architecture. Furthermore, the number of connections between memories and processors is reduced, including the elimination of a dedicated communication channel. Segmentation is provided such that some hosts can have access to parts of the memory whereas others may not. This makes memory device sharing possible in secure environments, such as for baseband software. For example, an application processor 281 can load a baseband software image into SPDRAM 285 and indicate to baseband processor 282 that the image is ready. The baseband processor 282 then removes access to other hosts and then checks the validity of the image. If it is correct, the baseband processor 282 may proceed to operate from that image without disruption from software running on the application processor 281.

Figure 2F:
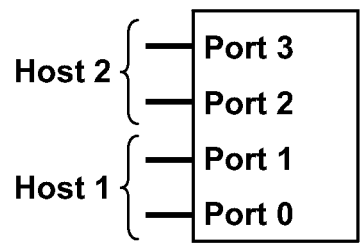
FIG. 2F illustrates embodiments of multiple-host binding configurations.
Figure 2F:
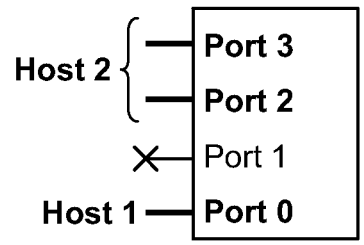
Figure 2F:
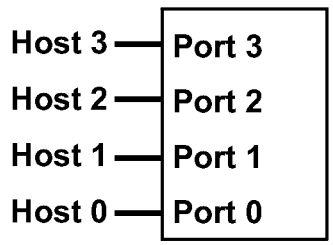

FIG. 2F illustrates embodiments of multiple-host binding configurations 286, 287, 288. In one embodiment, multiple port binding can be combined with multi-host functionality. For example, if one host, such as an application processor 281, requires more bandwidth, it can use several bound ports for its interface, while other another hosts may continue to use a single port. In the illustrated embodiment, a few combinations 286, 287, 288 of binding several hosts on a four-port device are provided. For example, in combination 286, each of hosts 1 and 2 interfaces with two ports. In combination 287, host 1 interfaces with port 0, while host 2 interfaces with two ports 2, 3. In combination 288, each host interfaces with a single port. It is contemplated that any combination of host-port binding or interfacing can be provided, such as a single host can bind all four hosts together. Exactly which ports are assigned to which hosts may depend on a register setting that gives the length of a bound port group.

Figure 2G:
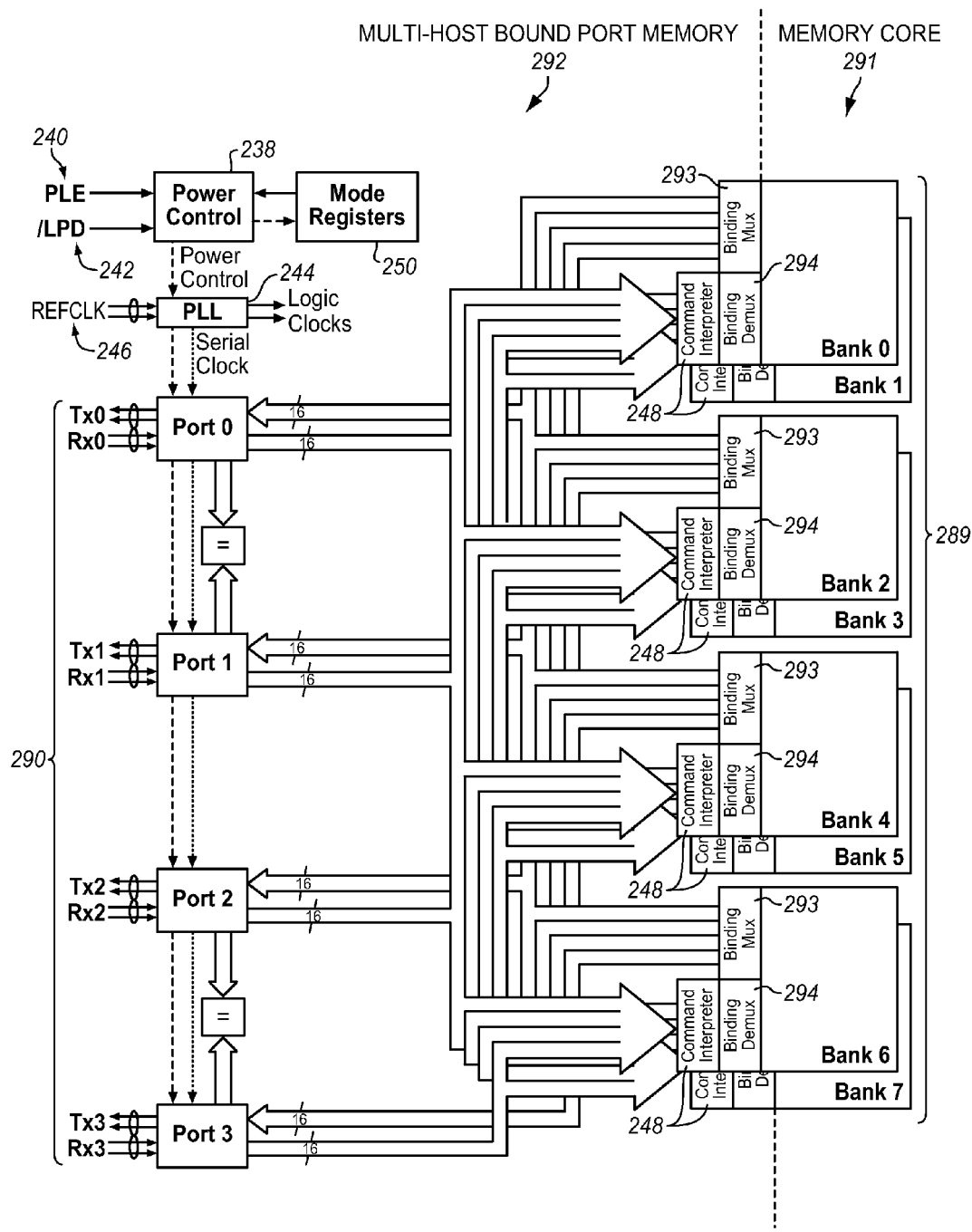
FIG. 2G illustrates an embodiment of a multi-host bound port memory.

FIG. 2G illustrates an embodiment of a multi-host bound port memory 292. The illustrated multi-host bound port memory (multi-host memory system) 292 having four ports 290 is in communication with a memory core 291 having 8 banks 289. For simplification and brevity, limited number of ports 290 and banks 289 are illustrated. Although this multi-host memory system 292 is similar to the single-host memory system 204 of FIG. 2A, here the data from each port 290 is available individually to each bank 289. In this embodiment, a bank 289 is defined as part of overall multi-host memory system 292 which can be independently addressed for data transfer. Further, by providing individual access, a single port of ports 290 can be associated with a single bank of banks 289 for the duration of an instruction without conflicting with other ports accessing other banks. The binding multiplexers 293 and demultiplexers 294 are multiplied to produce a possible embodiment of a crossbar switch for directing data between banks 289 and multiple port groups of ports 290.

FIG. 2H illustrates embodiments of a port binding control register 295 for up to 16 ports and a duplicate command check register 296 for up to 16 ports. For brevity and simplicity, this embodiment assumes that bindings occur on consecutive ports of binary multiple (e.g., ports 1, 2, or 4) with matching modulus (e.g., port 0 for 4 ports, ports 0 or 2 for 2 ports, or any port for single port). Ports may determine their own membership in a binding group based on a register setting. A 16 port binding control register 295 is illustrated. The bindings are described as and provide a hierarchical pattern, such as when if no bits are set, all ports work independently. For a two port device, merely bit 0 is used, while for a four port device, bits 0 through 4 describe the possible bindings by adding the remainder of the two port bindings for four ports and binding all ports. For an 8 port device, the remainder of the two port bindings in bits 8 thorough 11, the four port bindings in bits 13 and 14, and all ports in bit 15. This pattern can be continued ad infinitum.

Further, ports may not belong to a binding group, in which case they may operate on their own. Ports may not be part of a binding group and operate individually, or they can they be part of more than one binding group. One technique for settling such a conflict is to select the largest binding group specified. As a port is added to a binding group using this register 295, the next command is then used within the context of the binding group, and no command must be issued before a new port is ready. When a port is removed from a binding group, it may be disabled or used on its own immediately thereafter.

Furthermore, one bit per port is assigned into a register to enable duplicate command checking as illustrated here as the duplicate command check register 296. If a port is bound into any group, it checks its command value with its consecutive port. If it is not bound to a group, then the duplicate is found in its consecutive cycle.

Figure 2I:
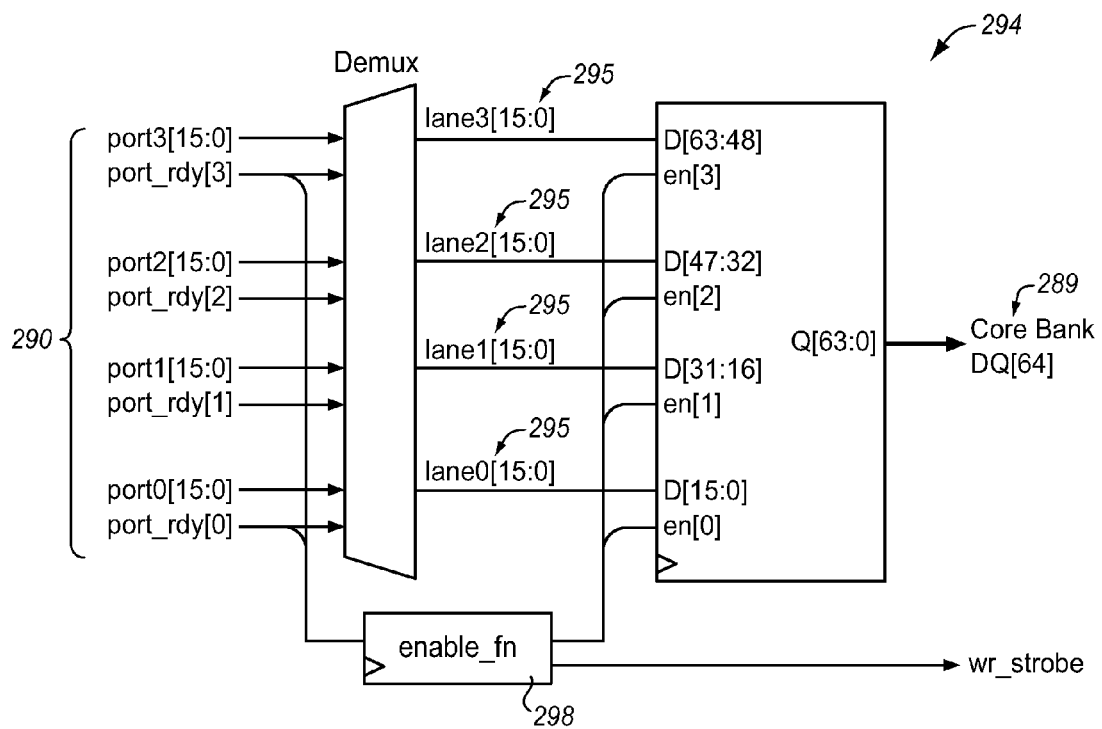
FIG. 2I illustrates an embodiment of a binding demultiplexer.

FIG. 2I illustrates an embodiment of a binding demultiplexer 295. In one embodiment, port ready lanes 295 (e.g., port_rdy lanes) are produced by individual ports 290 given their binding instructions. For example, when the four ports 290 are bound, all port ready lanes 295 are asserted. However, if merely ports 2 and 3 of ports 290 are bound in a two port group, then port_rdy[3:2] of port ready lanes 295 are asserted. Similarly, if port 1 is working alone, then only port_rdy[1] is asserted. This technique is used to determine the size of the transfer and the routing from ports 290 to the correct port ready lanes 295 going to the memory bank 289 as well as the latches that build an entire memory word for storage.

FIG. 2J illustrates embodiments of tables 296, 297 illustrating binding demultiplexer routing. For example, as data arrives, the demultiplexer routes port data to the correct lanes according to the routing function table 296. The demultiplexer register then captures the data into the correct port lanes bound for memory according to the function of enable_fn (298 in FIG. 2I) as described in table 297. Once all of the data has been latched, the core is commanded to store the data by enable_fn 298 using wr_strobe.

A write masking function or inhibiting the storage of selected data can be accomplished using a parallel data path. At the beginning of a storage cycle, all masks are set (e.g., all lanes inhibited) according to enable_fn. As data arrives, the associated masks are routed and stored along with the data. If not all data arrives (e.g., interrupted or short transfer), merely the data that arrived is stored because data lanes that do not arrive do not have the opportunity to clear the associated masks.

Figure 2K:
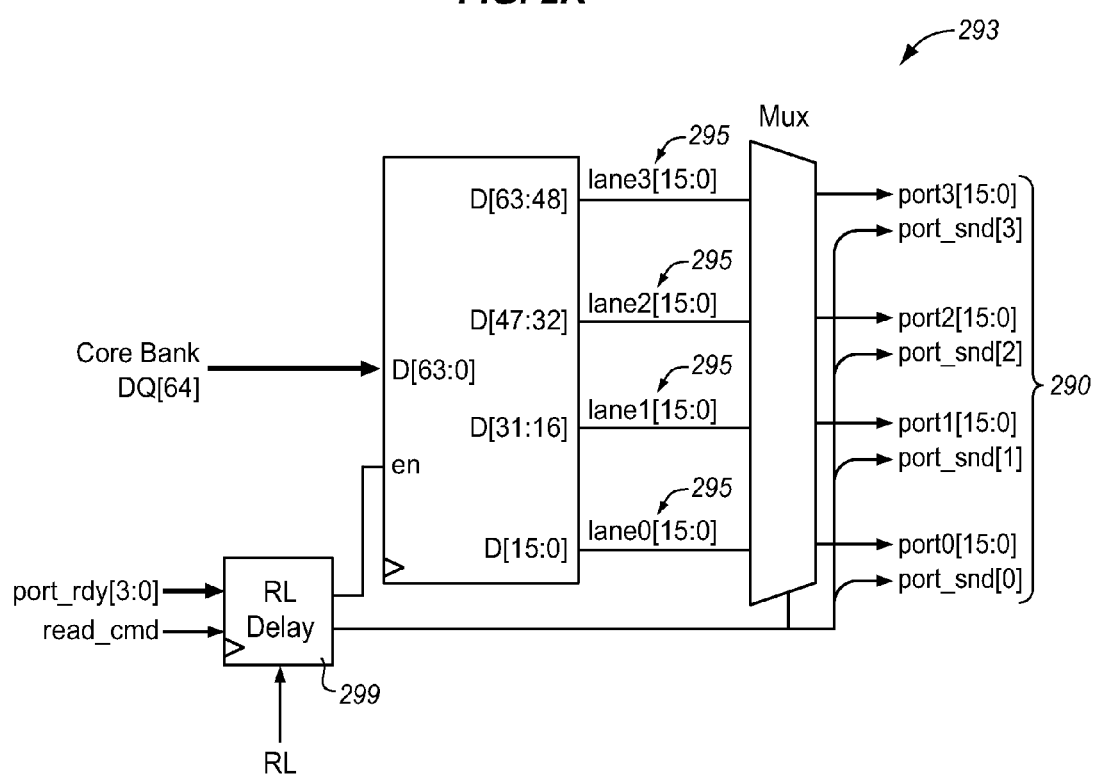
FIG. 2K illustrates an embodiment of a binding multiplexer.

FIG. 2K illustrates an embodiment of a binding multiplexer 293. In one embodiment, port ready (e.g., port_rdy) 295 and read command (e.g., read_cmd) signals are delayed by the read latency (RL) 299 of the memory such that the data arrives from the memory (and latched) in time to select the output ports 290. The selection of such ports is simply done using the delayed input values. The port_rdy lanes 295 from a read command are interpreted by the multiplexer 293 similar to the interpretation of the demultiplexer 294. The multiplexer selects the lane mapping to output ports 290 based on the functions illustrated in table 279 of FIG. 2L.

For brevity and simplicity, it is assumed that it is possible to deliver one (64-bit) data word from memory on each cycle and that there is storage or delay possible to reduce the data rate to cover single port cases. In case more cycles are required to fetch the data than the output cycles, a core is built with a 'pre-fetch buffer' that loads larger words from memory and selects shorter segments over consecutive cycles. In this case, the data latch can be combined with the pre-fetch buffer. To throttle data, the command interpreter can split read commands to shorter quantities and issue intermediate commands at a slower pace to match the output rate.

Figure 3:
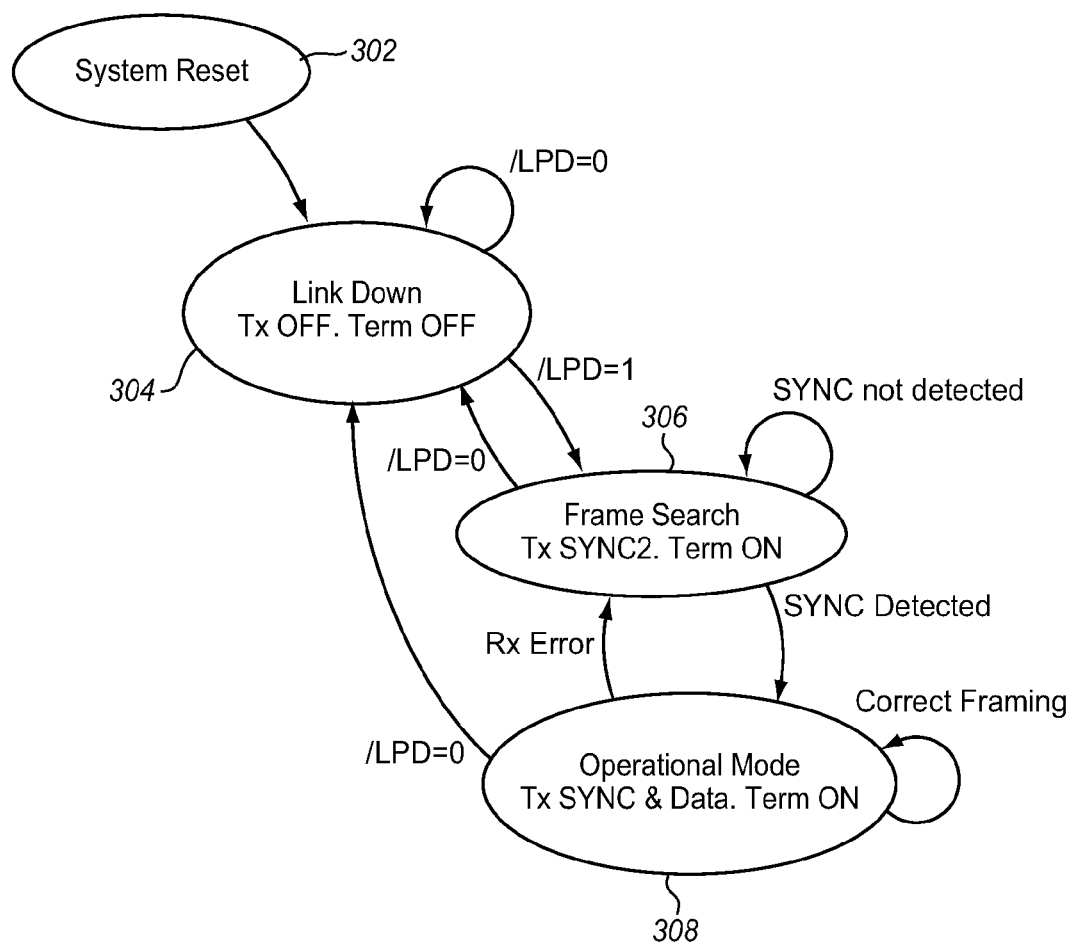
FIG. 3 illustrates an embodiment of a process for frame synchronization.

FIG. 3 illustrates an embodiment of a process for frame synchronization. Initially, the memory port is powered-off for a system reset 302. To power-up the port, Link Power-Down (/LPD) is driven high 304 as /LPD equals zero, and the port is disabled. When, however, /LPD equals 1, the frame search begins 306 for a specific code or bit sequence called SYNC. When SYNC is detected, the process goes into an operational mode 308. This process is may continue for multiple ports (if employed) as described in FIG. 4.

Since the host and memory exchange data serially, a receiver is synchronized to determine the correspondence of a bit's position within a frame. To determine correct synchronization, the link searches for a specific bit sequence during "Frame Search" condition 306. For example, initially, the serial link sends one of two synchronization bit sequences: SYNC and SYNC2. Used by both host and memory, the Rx-PHY detects these framing data packets. SYNC plays a key role in the link bring-up after a reset or error. Also, SYNC is sent by the memory Tx-PHY during any unused frames in a normal operation. The host Tx-PHY sends either SYNC or SYNC2 during the unused frames in the normal operation. The process proceeds into the normal operation mode 308 when SYNC is detected and recognized from the memory. If framing fails, as indicated by a 20 bit decoding error, for example, then the memory returns to "Frame Search" condition 306 until SYNC is once again detected. In any state, if /LPD goes to zero, indicating the port returns to the "Link Down" state and starts over.

SYNC2 is sent by the memory to indicate an error in receiving host data either because of leaving "link down" state or a framing error. The host responds by sending SYNC exclusively until the memory reestablishes framing and starts sending SYNC. The host sends SYNC2 between commands for proper error recovery operation. SYNC and SYNC2 establish and recover link framing and the host orchestrates the link establishment.

Figure 4:
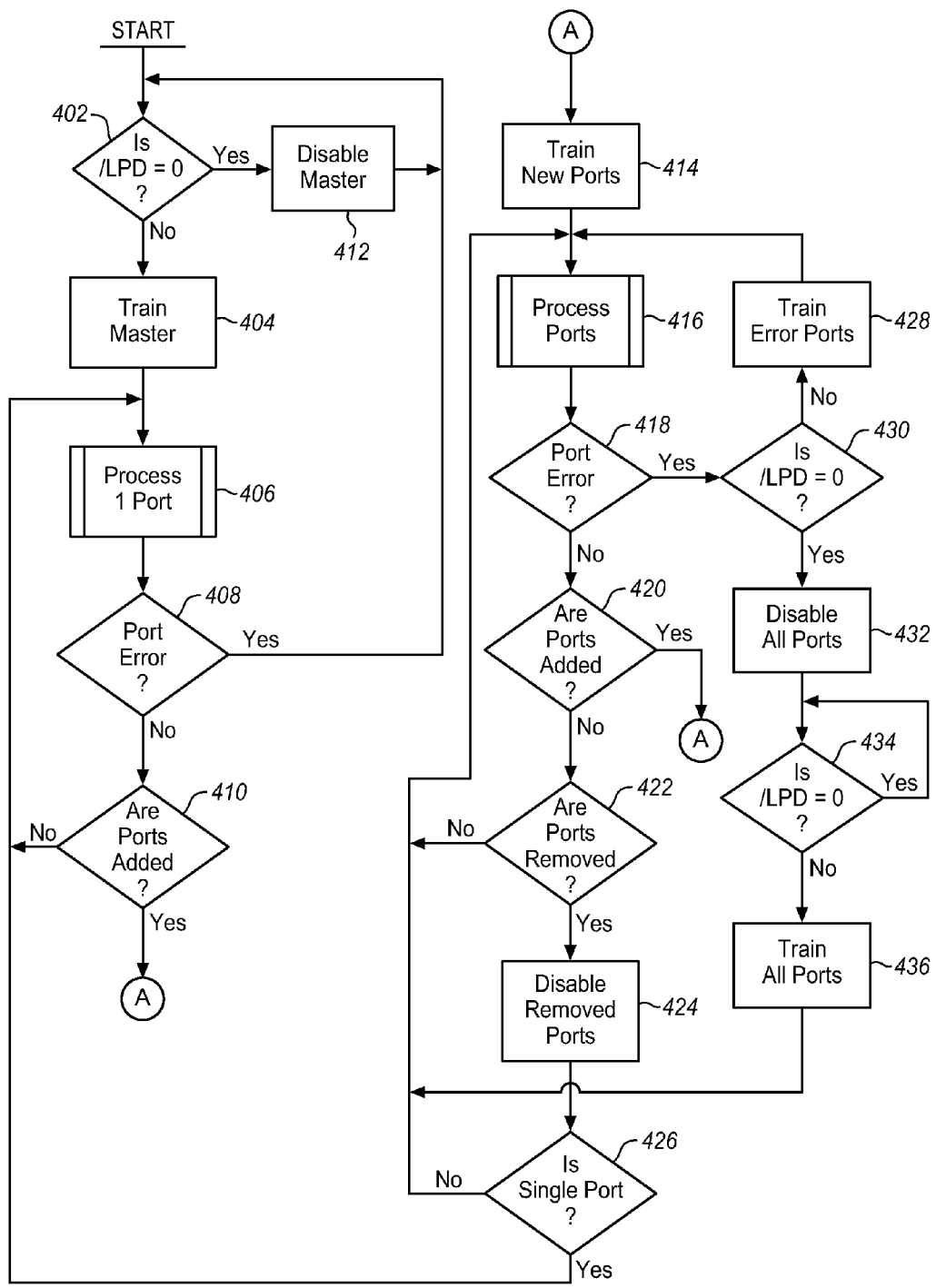
FIG. 4 illustrates an embodiment of a process for power control.

FIG. 4 illustrates an embodiment of a process for power control. /LPD (link power down) is received. At decision block 402, a determination is made as to whether a port is on. The slash before /LPD represents inverse logic, such as when /LPD equals zero, the link is powered down, meaning it is not powered up. Similarly /LPD equaling 1 represents not powered down, meaning it is powered up. If /LPD equals 1 (e.g., the link is powered up), a training process is performed, at processing block 404, to seek a frame for a specific code or bit sequence (e.g., SYNC). The training process for SYNC searching continues until SYNC is detected and then the process enters into an operational mode at processing block 406. This process is further described with respect to FIG. 3. At decision block 408, a determination is made as to whether there is a port error. If yes, the process continues with decision block 402. If not, a determination is made as to whether more ports have succeeded into getting into the operation mode at decision block 410. If no other ports are added, the process continues in the operational mode at processing block 406. If, however, additional ports are detected, the process continues with training new ports at processing block 414.

These additional (multiple) ports are processed at processing block 416. The use of multiple ports is also described with reference to FIG. 9. At decision block 418, a port error is determined. If a port error is determined such as the one caused by the port being powered down (e.g., /LPD=0) at decision block 430. If yes, all ports are disabled at processing block 432 and the process may continue in a single port mode at decision block 434. If, at decision block 434, /LPD is not zero (e.g., /LPD=1), all ports are trained at processing block 436 and the process continues with processing block 416. Referring back to decision block 430, if /LPD is not zero (e.g., /LPD=1), the process continues with training the error ports at processing block 428 and then further continuing with processing block 416.

Referring back to decision block 418, if no port errors are found, another determination is made as to whether there are more ports added at decision block 420. If yes, the process continues with the training process of new ports (e.g., seeking SYNC for each of the new ports) at processing block 414. If no additional ports are enabled, a determination is made as to whether any of the ports removed at decision block 422. If not, the process continues with processing block 416. If yes, any removed ports are disabled at processing block 424. At this point, at decision block 426, a determination is made as whether a single port is available to return to the single port mode. If yes, the process continues in single port mode with processing block 406. If not, the process continues in multiple port mode with processing block 416.

Power control 238 (of FIG. 2A) is responsible for propagating /LPD, while ports 206-212 are responsible for training themselves and processing of FIGS. 3 and 4.

Figure 5:
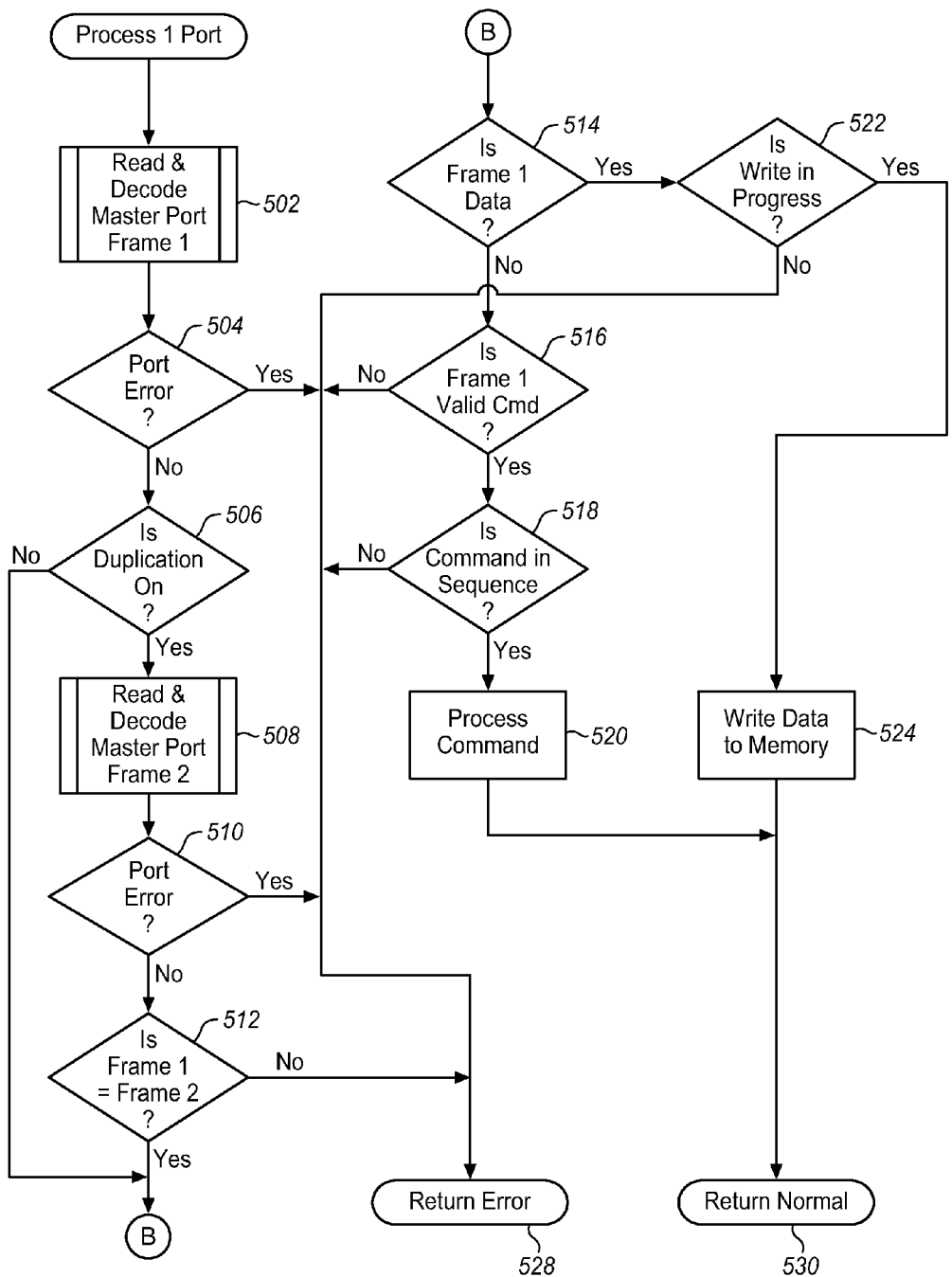
FIG. 5 illustrates an embodiment of a process for duplication check and command interpretation employing a single port.
Figure 9:
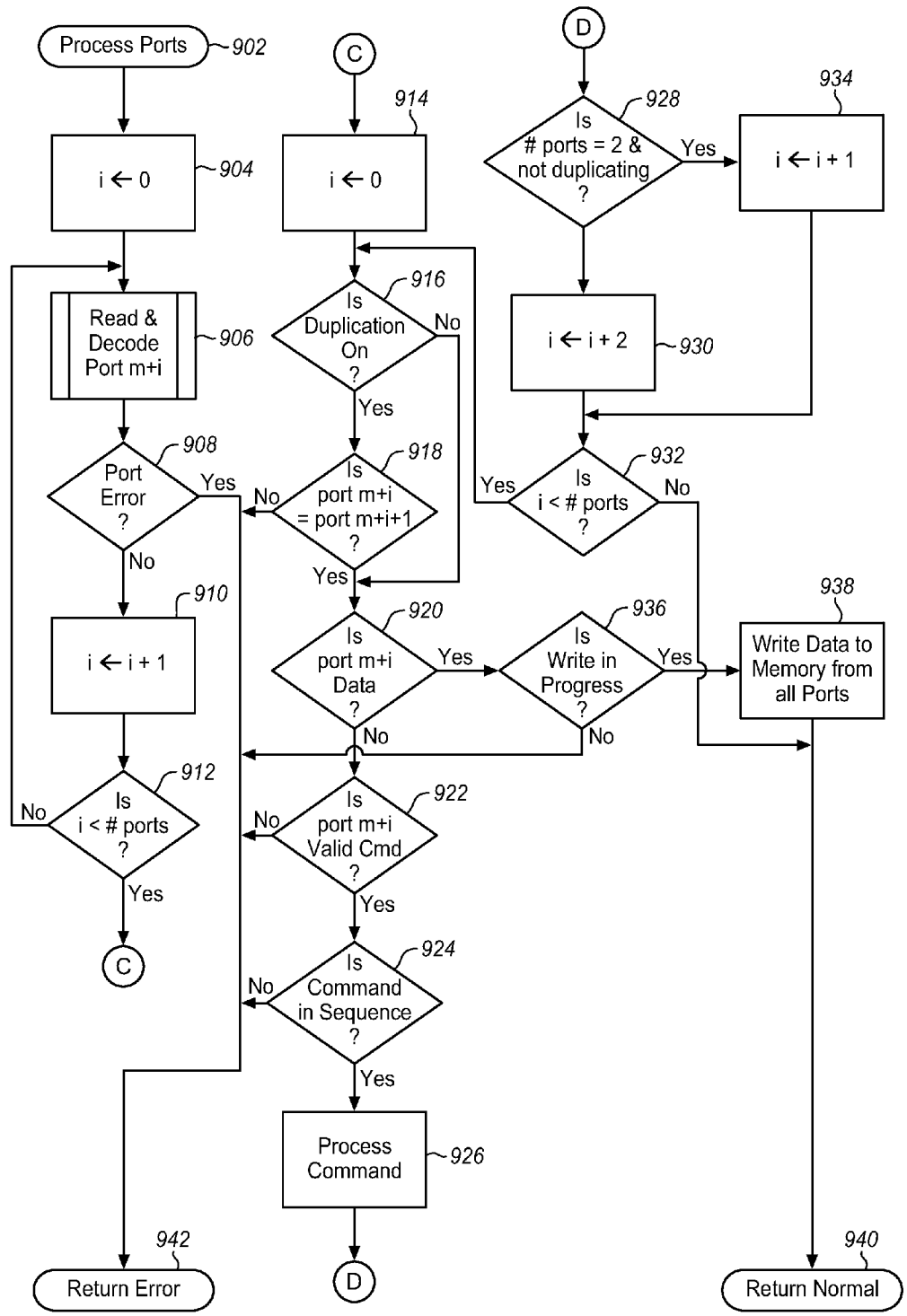
FIG. 9 illustrates an embodiment of a process for duplication check and command interpretation employing multiple ports.

FIG. 5 illustrates an embodiment of a process for duplication check and command interpretation employing a single port. The more complex process employing multiple ports is illustrated in FIG. 9. As further illustrated in FIG. 5, receiving, reading and decoding of data is performed at a port (e.g., first port or master port) starting with the first frame at processing block 502. At decision block 504, a determination is made as to whether a port error was detected. If an error is detected, the process ends with a return error at block 528. If no port error was detected, at decision block 506, a determination is made as to whether duplication is on. It is contemplated that duplication can be turned on or off as necessitated or desired. If duplication is on, the process continues with receiving, reading and decoding of the data is performed at a port now with the second frame at processing block 508. Again, at decision block 510, a determination is made as to whether a port error is detected. If yes, the process ends with an error return at block 528.

If no port error is detected (and duplication is not on, referring back to decision block 506), the process moves to determine whether the frame is command or data. If the frame is a command, a determination is made as to whether the command is valid at decision block 516. If the command is not valid, the process ends with a return error at block 528. If the command is valid, a determination is made as to whether the command is in sequence or in the right place at decision block 518. If the command is not in sequence, the process ends with a return error at block 528. If the command is in sequence, the command is processed at processing block 520 and a normal return is issued at block 530.

Referring back to decision block 514, if the frame is data, a determination is made as to whether the memory is prepared for write operations at decision block 522. If not, the process ends with an error return at block 528. If yes, the data is written to memory at processing block 524 and the process ends with normal return at block 530. In this embodiment, processes of blocks 516, 518, 520 are performed at command interpreter 248 of FIG. 2A, while the rest of the processes are performed at ports 206-212 of FIG. 2A.

Figure 6:
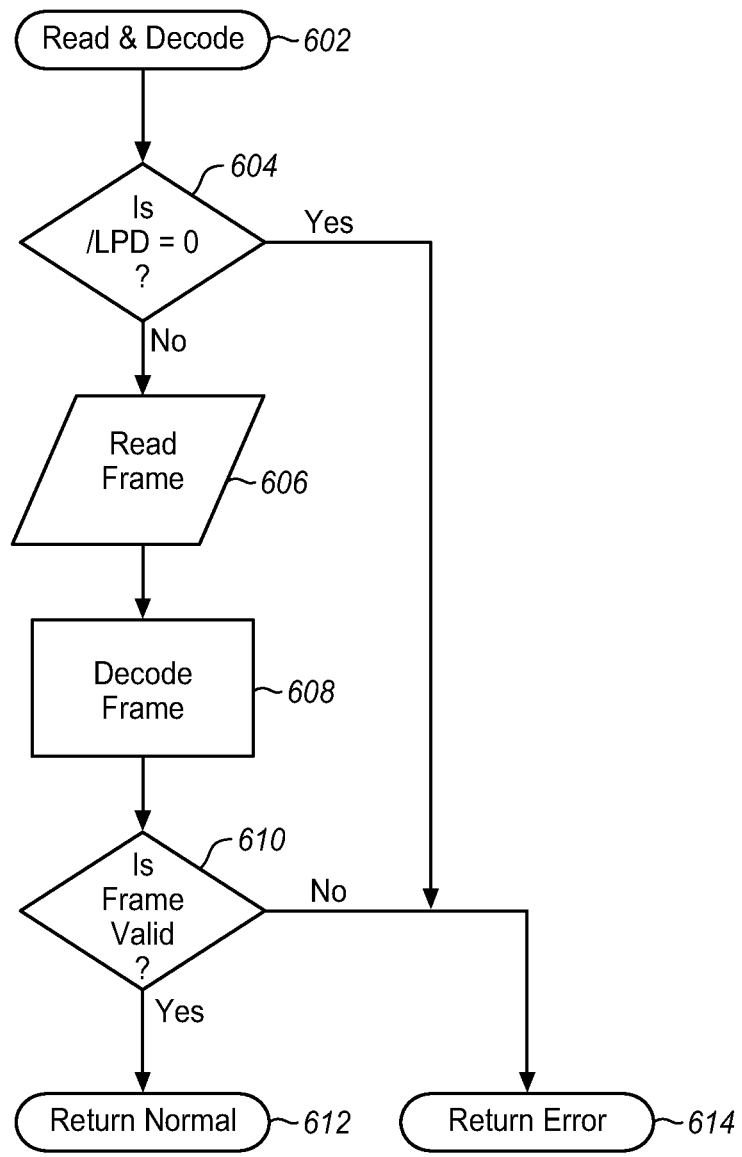
FIG. 6 illustrates an embodiment of a process for receiving and decoding frames within a port.

FIG. 6 illustrates an embodiment of a process for performing various functions within a port. At block 602, a process of receiving, reading and decoding a data stream is provided. For example, a single data stream (in bits) is received at a port via an Rx and is formed into parallel streams and then decoded (e.g., using 17B/20B decoding) as illustrated here. A link power down (/LPD) signal is used to control the power to all ports (via the power control mechanism), such as the power coming into and going out of all ports of a single host bound port memory as illustrated in FIG. 2A (e.g., the dotted line of in FIG. 2A represents the power control of /LPD). At decision block 604, a determination is made as to whether /LPD equals zero. If it is zero, an error is returned at block 614 that ends the process. If, however, /LPD does not equal zero, the process continues at processing block 606.

At processing block 606, a data frame is read that includes the port receiving a bitwise data stream and producing a parallel stream of frames (e.g., 20 bit, de-serializing). The frame is decoded (e.g., using the 17B/20B decoding technique) which then produces validity data at processing block 608. At decision block 610, the validity of the frame is checked; for example, a determination whether the frame had a 20 bit code that decoded correctly into a 17 bit value If this conversion fails, such as it does not produce any result due to ambiguity, the validity fails and an error is returned at block 614. If, however, the conversion is successful and results are produced, the data frame is deemed valid and a normal is returned at block 612 and further as illustrated in FIG. 9.

Figure 7A:
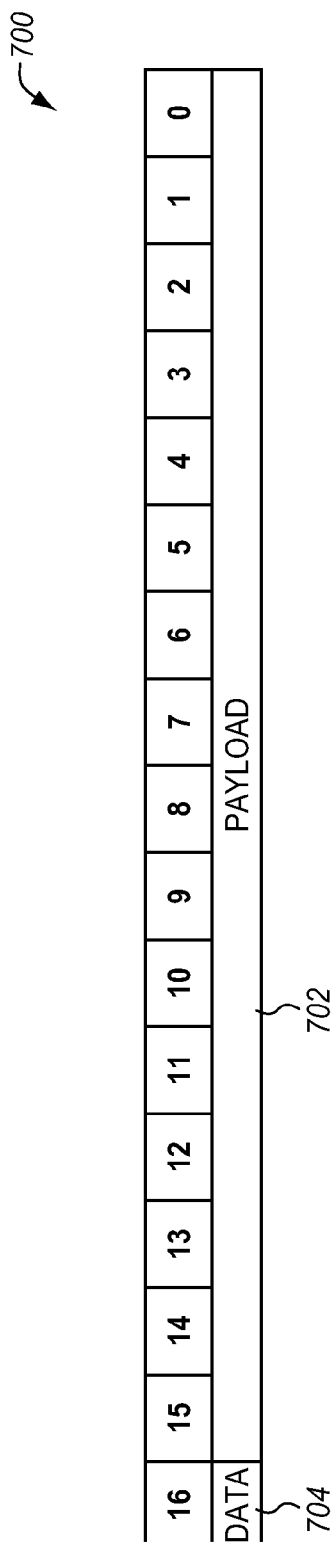
FIG. 7A illustrates an embodiment of a 17-bit post-decoded frame (format)

FIG. 7A illustrates an embodiment of a 17-bit post-decoded frame format 700. The illustrated embodiment of a 17-bit decoded frame 700 may be used to transmit 17-bit data, commands, and/or status, and undergo transition encoding to produce 20-bit frames for serial transmission. Data, commands, and status are transmitted and received in 20-bit frames. When received, the reverse process is performed where a 20-bit transition encoded frame undergoes decoding to produce a 17-bit frame 700 holding data, commands, and status.

The illustrated 17-bit post-decoded frame (format) 700 dedicates the first 16 bits to payload 702 and the last one bit (e.g., the 17$^{th}$ bit) to a payload indicator 704. Memory access formats build on the basic decoded format. For example, bit 16 704 indicates whether the payload is set to one or zero for data, command, or status. Commands and write data are able to share the receiver link on a frame-by-frame basis. To reduce latency, commands may be inserted in, or preempt, a write data stream, delaying the completion of the write command.

FIG. 7B illustrates an embodiment of a command, status, and data encoding frame format 720. The illustrated embodiment includes, but is not limited to, an embodiment of a Serial Port DRAM (SPDRAM) command, status, and data encoding frame 720. The illustrated 17-bit encoding frame 720 is extensible as it provides the flexibility to reserve a number of bits to add additional commands in the future as, for example, the technology changes or demands. For example, flags 722 and sub-commands 724 occupy the first seven bits (bit 0 through 7) of the frame 720 and since most entries in sub-commands 724 are 1's, this area, including the flag area 722, can be used in the future to add additional commands (e.g., up to 16 commands), expanding the frame 720.

Similarly, there are other sections with limited scope, such as mode register group 726, which can also be used for additional commands (e.g., the sub-commands area of the mode register group 726 having merely three commands). Another such area is DRAM command group 728 (e.g., the sub-commands area of DRAM command group 728 having all 1's) that can also be used to add other commands.

SYNC 730 controls and maintains link frame synchronization, while SYNC2 732 indicates a particular link operational state. Both SYNC 730 and 732 are further discussed with respect to FIGS. 3 and 4. Data frame 734 includes a 17-bit frame similar to data frame 700 illustrated in FIG. 7A having the 17 bit set to 1 followed by two 8-bit bytes. Activate bank (ABNK) 736 and activate (ACT) 738 are discussed in FIG. 7C. The write command (WR) 740 initiates a memory write cycle to the specified bank and column. Write mask (WMSK) 742 sets an 8 byte mask for the write command in progress and follows a WR command 740 to have any effect. WMSK 742 is further discussed with reference to FIG. 7D.

Read (RD) 744 refers to a read command to initiate a memory read cycle, while burst stop (BSTP) 746 refers to a command to interrupt a port's current read or write command, depending on the bank specified. Precharge (PCG) 748 refers to a command that precharges the bank specified in the command, while precharge all (PCA) 750 includes a command that simultaneously precharges all banks. Per-bank refresh (REFB) 752 provides that the specified bank is automatically refreshed, while all-bank refresh (REFA) 754 provides all banks are refreshed according to an internal counter. All banks are in precharge sate before issuing the REFA command.

Mode register write (MRW) 758 refers to a command to perform a write to a mode register. Mode register write data (MRD) 760 provides write data following the MRW command 758 on the next immediate frame from port 0 in the form of an MRD command 760. Mode register read (MRR) 756 refers to a command to perform a read from a mode register. Self-refresh power-down (SRPD) 762 causes the memory core to enter the self-refresh state immediately. Power-down exit (PDX) 764 refers to a command that is issued to exit self-refresh power-down and is used to wake the memory core after link establishment.

FIG. 7C illustrates an embodiment of ABNK and ACT commands 736, 738. In order for two or more commands to be sent at the same time, they are to either support each other's functions or be functionally orthogonal. A third criterion includes complexity because memory semantics or implementation decisions may cause a failure in othogonality. For example, a serial port DRAM may have a command that activates a bank and the row address to be activated is too long for one frame. In a single port case, this command may require two or more frames, but with bound ports, it can be communicated in one frame time on two or more ports.

For example, ABNK 736 sets the target bank 752 and upper 5-bits of the row address 754 to be used with subsequent activate (ACT) commands 738. An activate command 738 is sent to the bank 752 specified in the last ABNK command 736. If two or more ports are bound, an optional ABNK 736 command can appear on port 2. The lower 15 bits of the row address 764 are specified in the least significant 15 bits of the ACT command 738, the 5 most significant bits are specified in the lower 5 bits of the last ABNK command 736 or the ABNK 770 appearing on port 2. This example points out that each command 736, 738 can stand on its own in subsequent frames at anytime. This enables variable port group sizes, common controllers independent of port group size, and consistent semantics across port bindings. Also, the commands 738, 770 complement each other and can be executed at the same time.

FIG. 7D illustrates an embodiment of a WMSK and WR command 742, 740. FIG. 7D illustrates a WR command 742 and the associated byte/write mask 742 for selective writing. WMSK 742 represents a command that sets an 8 byte mask 772 for the WR command 740 in progress and follows a WR command 740 to have any effect. After 8 bytes of data are communicated, the mask 772 starts over for the next 8 bytes. The letter 'H' in the mask 772 refers to the high byte (e.g., bits 15 thru 8), while 'L' refers to the low byte (e.g., bits 7 thru 0) of the word transfer.

WR command 740 initiates a memory write cycle to the specified bank 774 and column 776. Once the WR command 740 is sent, the write data follows. If two or more ports are bound, an optional WMSK command 780 is sent on port 2 covering or masking 778 the first 8 bytes. The mask 778 repeats for every 8 bytes unless it is reset by a subsequent WMSK command. Other examples of 2 or more port binding include combinations of read and write at the same time or activation and writing at the same time, depending on memory and interface semantics.

Figure 8A:
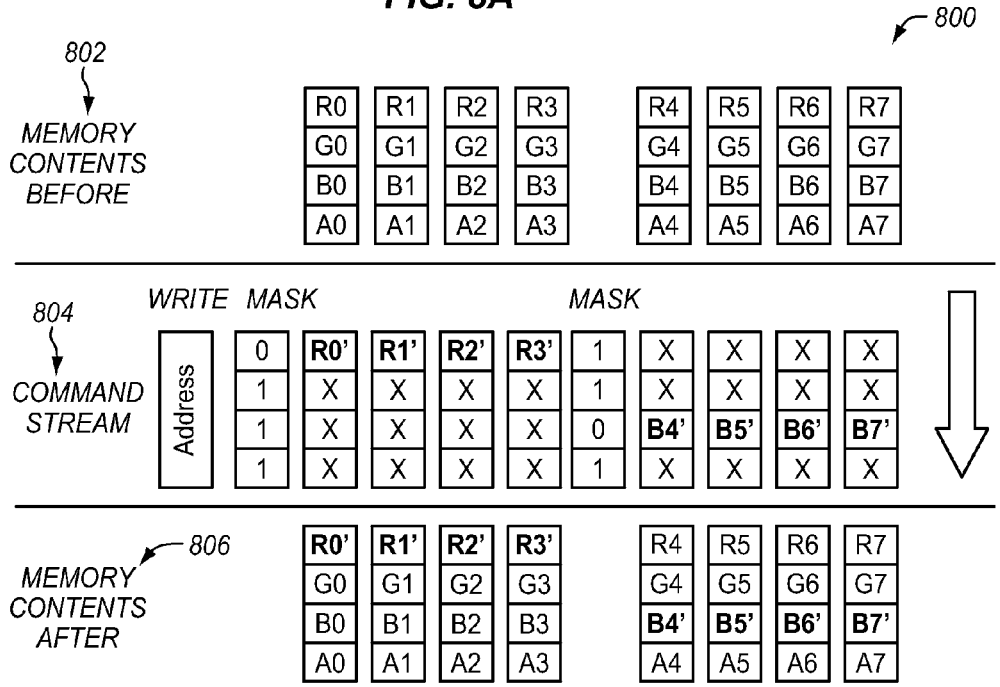
FIGS. 8A, 8B and 8C illustrate embodiment of write mask models.
Figure 8B:
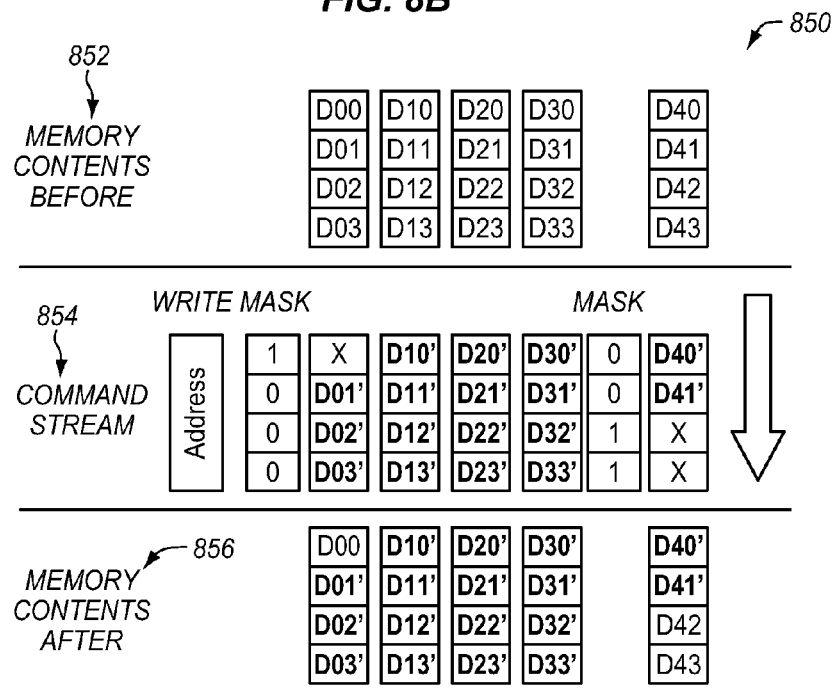
Figure 8C:
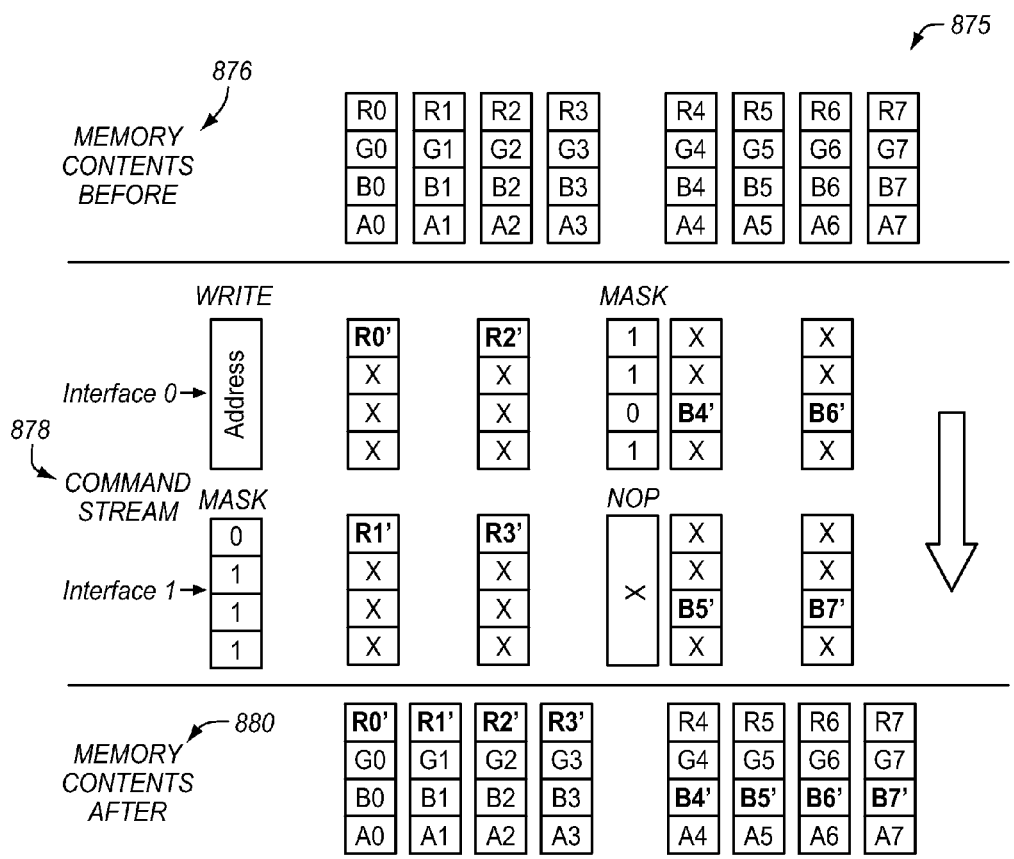

FIGS. 8A, 8B and 8C illustrate an embodiment of write mask models 800, 850, 875. For a memory that uses serial communications, a reduction in the number of bits for an indivisible transfer is used to reduce latency. An indivisible transfer is defined as a frame or word length in bits that describes one whole data quantity (such as a byte) or an executable command including any immediate operand data required to complete the command, such as 'write' and the target address.

For most memories, the write operation includes the WR command, address, operator (mask in this case), and write data simultaneously. For faster memory devices, the speed required to describe the command becomes prohibitive, so a burst transfer is used. A burst transfer is initiated with the command and the initial data, but continues with a stream of data with subsequent addresses being calculated (e.g., incremented). Whenever data is transferred, it is accompanied by additional write mask indication signals.

With serial communication, coding the command, address, write mask, and data all at once can be inefficient because the command and address may not be necessary for subsequent data transfers. To this extent, the data follows the WR command and the address, using burst transfers to commit the data. To reduce latency, a write mask, or WMSK command (e.g., 1 bit per byte) need only accompany the data depending when values to locations within the write burst are not to be stored. Although such optimization could be critical for serial interface efficiency, this scheme can be used to reduce bandwidth requirements in a parallel memory interface. Since serial interfaces improve the practicality of multi-host memory, each host has the ability to use independent write masks for independent transfers by placing the write mask within the command stream. To reduce the dependency of including WMSK with the data to decrease latency, three use models within a burst are assumed and illustrated here.

FIG. 8A illustrates an embodiment of a repeating pattern WMSK model 800 including memory contents before 802, command stream 804, and memory contents after 806. In this illustration, WMSK repeats for each transfer; such as changing only the red value within a rectangle consisting of red, green, and blue data, the other two colors would be masked and this WMSK would repeat over all RGB (red, green, blue) data within the rectangle. FIG. 8B illustrates an embodiment of an initial and terminal WMSK model 850 including memory contents before 852, command stream 854, and memory contents after 856. Here, the write mask is used only for the initial part of the transfer. For example, a network packet may start on an odd transfer boundary (the second byte of a four byte transfer) to optimize access (align) to the rest of the data structures in the packet. Once the initial mask is exhausted, the entire rest of the packet data is written to memory. To complete the transfer, a new WMSK is inserted to trim the last two bytes. FIG. 8C illustrates an embodiment of using multiple serial interfaces for repeating pattern WMSK model 875 including memory contents before 876, command stream 878, and memory contents after 880. Here, WMSK is used for a single transfer that selects one data structure within the transfer size. For example, writing only the second byte out of a 32-bit integer.

With regard to models 800, 850, write masks are either reused or used infrequently. For example, several types of transfer, such as cache writes and mass storage transfers require no masking. In these cases, it is inefficient to include the write mask with the data because it would not be used most of the time. A transfer that is as small or smaller than a unit transfer does not reap the benefits of burst transfers, so the data, command, address, and write mask all are specified. Such short transfers usually occur internal to a cache memory, relieving the burst-oriented memory from frequent operations of this type.

Focusing on the assumptions in models 800, 850, the write mask is included with the data, but it is insufficient to bind the write mask with the command if the benefits of burst transfers are to be reaped. To this extent, a decoupling of the write mask transfer from the command and the data has been realized as a new command. In a single serial stream, consisting of indivisible transfers (frames), a write command is issued with its address in one frame, and the data streams to the calculated memory addresses in a sequence of frames, and write masks are described as an individual command and apply to unit bursts, issued after the write command and within the data as required. A unit burst is defined as the number of bits to which a single write mask bit applies multiplied by the number of write mask bits within the write mask command. When the write command is issued, the write mask is cleared, such as all subsequent data is written. If a write mask command immediately follows the write command, it applies starting with the first unit burst.

If the repeating pattern described in model 800 is to be used, the mask repeats across all unit bursts. If the pattern is to be changed within the transfer, an additional write mask command is issued, causing the new write mask to apply to all subsequent data. If the initial pattern described in model 850 is to be used, the write mask is cleared after the first unit burst. If additional masking is required (e.g., within the terminal unit burst), an additional write mask command is issued that applies only to the next unit burst, at which time the write mask is cleared.

For model 875, a multiport version of model 800 is used wherein the mask is repeated, but the WMSK command occurs at the same time as the WR command but on a different port. If multiple serial interfaces are used, it is possible to produce a more flexible command layout. If two ports are used together, for example, the write command can be combined on one port with the first write mask on another port to improve bandwidth utilization.

FIG. 9 illustrates an embodiment of a process for duplication check and command interpretation employing multiple ports. Process ports starts at block 902 with the first port of multiple ports at processing block 904. A data stream having data is received (and then to be decoded) at the first port via a corresponding Rx at processing block 906. Referring to term "port m+i" of processing block 906, "m" refers to the binding group and "i" refers to the number in the binding group. In this embodiment, i starts at zero, while since a single host is employed, the m equals zero. At decision block 908, the first port (port 0) is checked for any errors. If an error is found, the process ends with an error return at block 942. If an error is not found, the process continues with checking the next port at processing block 910 until all ports are checked. For example, at decision block 912, a determination is made as to whether there are any more ports left. If yes, the process continues with processing block 906 with the next port. If not, the process continues with processing block 914.

At decision block 916, a determination is made as to whether duplication is on. If yes, at decision block 918, the current port is determined and the depending on the result, the process either ends with the return error at block 942, or (referring back to decision block 916, if duplication is not on) the process continues with decision block 920 where a determination is made as to whether the port has data. If the data is not duplicating, it is not going to compare. If there is data, a write operation is performed at decision block 936. If the write is not in progress, the process ends with the return error at block 942. If the write operation is being performed, the data is written to memory from all ports at processing block 938 and a normal return is performed at block 940.

Referring back to decision block 920, if the port does not have data, a command validation is performed at decision block 922. At decision block 922, a determination is made as to whether the port command is valid by, for example, checking a list of commands. If the command is not valid, the process ends with block 942. If the command is found to be valid, at decision block 924, a determination is made as to whether the command is in sequence (e.g., the command is in the right place). If the command is not in sequence, an error is returned at block 942. If the command is found to be in sequence, the command is processed at processing block 926.

At decision block 928, the next port is checked to see whether there is duplication of data at the next pair of ports. Since duplication of data generally involves a pair of ports, the number of ports is incremented by 2 to check the next two ports at processing block 930. Referring back to decision block 928, if the answer is yes, the next (single) port is selected at processing block 934. The process then advances to decision block 932 to determine whether more ports are to be processed. If yes, the process continues with decision block 916. If not, a normal return is issued at block 940.

In one embodiment, data is received at a port and a command is received at the port. The command is processed at command interpreter 248 (as illustrated in FIG. 2A) represented here by blocks 922, 924, 926, while duplication check is performed at a location indicated by a 2 triangle 254 (as illustrated in FIG. 2A) represented here by blocks 916, 918, 920.

Figure 10:
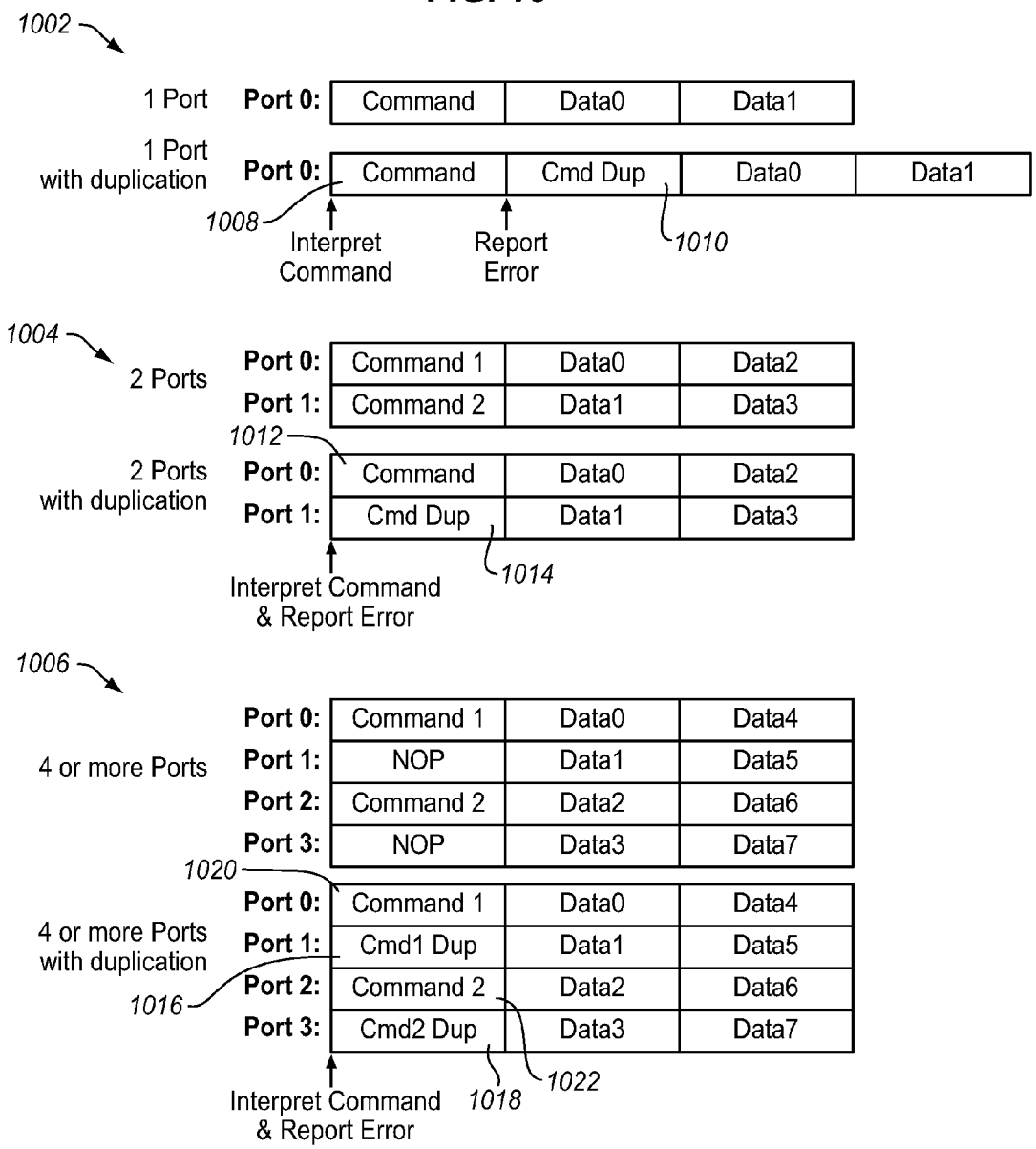
FIG. 10 illustrates an embodiment of command duplication models.

FIG. 10 illustrates an embodiment command duplication models 1002, 1004, 1006. In one embodiment, command duplication is used for enhanced error detection. Commands are sent twice and the original command is compared to the duplicate command. If one or two ports are used 1002, 1004, the duplicate command 1010, 1014 appears on the frame immediately after the original command 1008, 1012. If four or more ports are used 1006, duplicate commands 1016, 1018 appear on other ports.

Commands are selected specifically since: (1) in a bound port situation, duplication can be used to fill unused bandwidth; (2) command misinterpretation can cause unexpected results such as violation of command sequencing (e.g., activating an already activated bank or writing an unactivated bank) or corrupting a memory location that is not related to a current transfer; whereas, if a command is correct, then any bad data is at least restricted to the current transfer; and (3) although repeating data would produce superior results, the effective system bandwidth becomes half because the free space available to commands is not available in a data stream.

Command duplication models 1002, 1004, and 1006 illustrate a single port 1002 and combinations of bound ports 1004, 1006 with duplication. It further illustrates how duplication and multiple commands work together. For example, a maximum of two different commands are transferred in one frame time.

In the single port model 1002, commands are issued singly and their duplication 1010 follows after the command 1008. For the two port model 1004, the duplicate command 1014 is sent in the same frame time; however, if duplication is turned off, two commands can occupy the frame time. For 4 or more ports model 1006, two (or more) commands 1020, 1022 can occupy one frame time, and the two commands 1020, 1022 can be both duplicated into duplicate commands 1016, 1018 within the same frame time. There is no necessary restriction to the number of commands that are transmitted simultaneously nor the granularity of the number of ports within a group.

Depending on the use model 1002, 1004, 1006, it may be acceptable to execute commands opportunistically. This saves latency in some cases, but it is weighed against the possibility of error and the cost of dealing with the error. If duplicates are all available in one frame time, the error results are available immediately.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments of the present invention may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

One or more modules, components, or elements described throughout this document, such as the ones shown within or associated with an embodiment of a multi-host enhancement mechanism may include hardware, software, and/or a combination thereof. In a case where a module includes software, the software data, instructions, and/or configuration may be provided via an article of manufacture by a machine/electronic device/hardware. An article of manufacture may include a machine accessible/readable medium having content to provide instructions, data, etc. The content may result in an electronic device, for example, a filer, a disk, or a disk controller as described herein, performing various operations or executions described.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, CD-ROM, and magneto-optical disks, ROM, RAM, EPROM, EEPROM, magnet or optical cards, flash memory, or other type of media/machine-readable medium suitable for storing electronic instructions. Moreover, the present invention may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A method for reducing memory latency comprising:
communicating data between a host computer system and a memory via a port or a group of ports at the memory over multiple time intervals, wherein the host computer is coupled to the memory, the port being a member of the group of ports; and
communicating a command associated with the data between the host computer system and the memory via the port or the group of ports over a single time interval, wherein the command is duplicated into one or more duplicate commands to enhance error detection to prevent an errant command from corrupting memory operations, wherein the command is duplicated without having to duplicate the data.

2. The method of claim 1, wherein the membership of the port within the group of ports is changeable at any time during a memory operation.

3. The method of claim 1, further comprising communicating subsequent commands to the command via remaining ports of the group of ports not occupied by the command.

4. The method of claim 3, wherein the subsequent commands are communicated in the single time interval as the command.

5. The method of claim 1, further comprising communicating a duplicate command to the command via the remaining ports of the group of ports.

6. The method of claim 1, further comprising employing a masking scheme to inhibit writing of the data without including mask information within a same communication frame as the write data to further reduce a number of communication bits and the memory latency.

7. The method of claim 6, wherein the masking scheme is changeable within a data stream.

8. The method of claim 7, wherein the masking scheme is modified to inhibit writing of data without including mask information within the same communication frame as the write command.

9. The method of claim 7, wherein the masking scheme automatically repeats over subsequent unit transfers.

10. The method of claim 7, wherein the masking scheme terminates after a single unit transfer.

11. The method of claim 1, wherein commands are capable of insertion within a write data stream.

12. The method of claim 1, wherein status information is capable of insertion within a read data stream.

13. An apparatus to reduce memory latency comprising:
a host computer system coupled to a memory, the memory to receive data from the host computer system via a port or a group of ports at the memory over multiple time intervals, the port being a member of the group of ports; and
the memory is further modified to receive a command associated with the data from the host computer system via the port or the group of ports over a single time interval, wherein the command is duplicated into one or more duplicate commands to enhance error detection to prevent an errant command from corrupting memory operations, wherein the command is duplicated without having to duplicate the data.

14. The apparatus of claim 13, wherein the membership of the port within the group of ports is changeable at any given time during a memory operation.

15. The apparatus of claim 14, wherein the memory is further modified to receive subsequent commands to the command via remaining ports of the group of ports not occupied by the command.

16. The apparatus of claim 15, wherein the subsequent commands are communicated in the single time interval as the command.

17. A system to reduce memory latency comprising:
a host computer system coupled with a memory, the memory employing a port binding system to reduce the memory latency, the port binding system having a plurality of ports for communication of data and commands, wherein two or more ports of the plurality of ports are capable of being combined into one or more groups of ports, the port binding system to
communicate data between the host computer system and the memory via a port or a group of ports at the memory over multiple time intervals, the port being a member of the group of ports; and
communicate a command associated with the data between the host computer system and the memory via the port or the group of ports over a single time interval, wherein the command is duplicated into one or more duplicate commands to enhance error detection to prevent an errant command from corrupting memory operations, wherein the command is duplicated without having to duplicate the data.

18. The system of claim 17, wherein the membership of the port within the group of ports is changeable at any given time during memory operation.

19. The system of claim 17, wherein the port binding system is further modified to communicate subsequent commands to the command via remaining ports of the group of ports not occupied by the command.

20. The system of claim 17, wherein the subsequent commands are communicated in the single time interval as the command.

* * * * *